(12) United States Patent
Jung et al.

(10) Patent No.: US 11,676,771 B2
(45) Date of Patent: Jun. 13, 2023

(54) PEROVSKITE SOLAR CELL AND METHOD FOR MANUFACTURING SAME

(71) Applicant: Research & Business Foundation Sungkyunkwan University, Suwon-si (KR)

(72) Inventors: Hyun Suk Jung, Seoul (KR); Taekyu Ahn, Seongnam-si (KR); Zhu Jun, Suwon-si (KR); Bonghyun Jo, Seoul (KR); Han Gill Sang, Gunpo-si (KR); Dong Hoe Kim, Seoul (KR); Jidong Kim, Anseong-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 17/501,034

(22) Filed: Oct. 14, 2021

(65) Prior Publication Data

US 2022/0122782 A1 Apr. 21, 2022

(30) Foreign Application Priority Data

Oct. 15, 2020 (KR) .................. 10-2020-0133453

(51) Int. Cl.
*H01G 9/20* (2006.01)
*H01G 9/00* (2006.01)
(Continued)

(52) U.S. Cl.
CPC .......... *H01G 9/2009* (2013.01); *H01G 9/0036* (2013.01); *H01G 9/2027* (2013.01);
(Continued)

(58) Field of Classification Search
CPC . H01L 51/441; H01L 51/442; H01L 51/0004; H01L 51/0005; H01L 51/0007;
(Continued)

(56) References Cited

FOREIGN PATENT DOCUMENTS

| JP | 2017112185 A | * | 6/2017 |
| KR | 10-1794988 B1 | | 11/2017 |

OTHER PUBLICATIONS

Guan,Trap-State Passivation by Nonvolatile Small Molecules with Carboxylic Acid Groups for Efficient Planar Perovskite Solar Cells , and Supplementary material, J. Phys. Chem. C 2019, 123, 14223-14228 and S1-S12 (Year: 2019).*

(Continued)

*Primary Examiner* — Devina Pillay
(74) *Attorney, Agent, or Firm* — NSIP Law

(57) ABSTRACT

A method for manufacturing a perovskite solar cell, includes disposing an electron transport layer on a transparent conductive substrate, disposing an additive-doped perovskite light absorption layer on the electron transport layer, disposing a hole transport layer on the additive-doped perovskite light absorption layer, and disposing an electrode on the hole transport layer. The disposing of the additive-doped perovskite light absorption layer includes adding an additive having hydrophobicity to a perovskite precursor solution, and applying the additive-added perovskite precursor solution onto the electron transport layer to form the additive-doped perovskite light absorption layer.

8 Claims, 45 Drawing Sheets
(14 of 45 Drawing Sheet(s) Filed in Color)

(51) Int. Cl.
H10K 30/81 (2023.01)
H10K 30/30 (2023.01)
H10K 30/40 (2023.01)
H10K 71/12 (2023.01)
H10K 30/82 (2023.01)
H10K 71/15 (2023.01)
H01L 51/44 (2006.01)
H01L 51/42 (2006.01)
H01L 51/00 (2006.01)

(52) U.S. Cl.
CPC ....... H01G 9/2031 (2013.01); H01L 51/0003 (2013.01); H01L 51/0007 (2013.01); H01L 51/4253 (2013.01); H01L 51/4293 (2013.01); H01L 51/441 (2013.01); H01L 51/442 (2013.01)

(58) Field of Classification Search
CPC ............. H01L 51/0065; H01L 51/4293; H01L 51/0003; H01L 51/4253; H01G 9/2009; H01G 9/0036; H01G 9/2027; H01G 9/2031

See application file for complete search history.

(56) References Cited

OTHER PUBLICATIONS

Nakamura, JP2017-112185 A, MT (Year: 2017).*
Guan, et al. "Trap-State Passivation by Nonvolatile Small Molecules with Carboxylic Acid Groups for Efficient Planar Perovskite Solar Cells." *The Journal of Physical Chemistry C* vol. 123. Issue 23 (May 24, 2019): pp. 14223-14228.
Korean Office Action dated Feb. 9, 2022 in corresponding Korean Patent Application No. 10-2020-0133453. (7 pages in Korean).

* cited by examiner (a) (b) (c) (d) (e) (f) (g)

(a) (b) (c) (d) (e) (f) (g) (h) (i)

(a) (b) (c) (d) (e) (f) (g)

PEROVSKITE SOLAR CELL AND METHOD FOR MANUFACTURING SAME

CROSS-REFERENCE TO RELATED APPLICATIONS

This application claims the benefit under 35 USC 119(a) of Korean Patent Application No. 10-2020-0133453 filed on Oct. 15, 2020, in the Korean Intellectual Property Office, the entire disclosure of which is incorporated herein by reference for all purposes.

BACKGROUND

1. Field

The present application relates to a perovskite solar cell and a method for manufacturing the same.

2. Description of the Related Art

Since a perovskite solar cell, as a solar cell element using a material having a perovskite structure as a light absorber, has most of the characteristics required for existing next-generation solar cells, such as advantages that power conversion efficiency is high, the manufacturing cost is inexpensive, and low-temperature process and low-cost solution process are enabled, etc., it is in the spotlight as a next-generation solar cell to replace silicon solar cells.

With respect to a stability problem of the perovskite solar cell, a stability problem of a perovskite precursor is recognized as the most important challenge. Since a perovskite precursor solution exists in the form of a lead polyhalide colloidal dispersion composed of organic/inorganic molecules, the size of colloidal particles and the morphology of a thin film are very important. In order to make a perovskite thin film with the most ideal bandgap and high efficiency, a method of inducing black α-phase FAPbI$_3$ at room temperature by adding a small amount of MAPbBr$_3$ to an FAPbI$_3$ precursor solution is well known, and it has been reported that crystallinity and photoelectric properties of the perovskite thin film are affected by aging of the precursor solution. However, if time of such an aging is prolonged, there is a problem that an δ-phase perovskite, which is a secondary phase that degrades solar cell performance, is formed.

Further, many defects occur at the interface of grains constituting the perovskite thin film of a high-efficiency polycrystalline perovskite solar cell manufactured through the solution process, and for example, since an anion cavity, a non-crystallized lead cation, or the like acts as a charged charge trap through which ions move, there is a problem in that non-radiative recombination of electrons and holes and corrosion by moisture/oxygen increase.

Since optical properties and performance of the perovskite solar cell are deteriorated due to such problems, passivation of the surface of the perovskite thin film and stability improvement of the perovskite thin film are essential in order to overcome them.

Korean Registered Patent No. 1794988, which is the background technology of the present application, relates to a method for manufacturing a perovskite light absorption layer and a method for manufacturing a solar cell to which the same is applied. The above-mentioned registered patent discloses a perovskite solar cell in which the value of the short-circuit current is improved by reacting and removing a metal halide compound acting as an impurity in the perovskite, and the power conversion efficiency is improved accordingly. However, manufacturing a perovskite solar cell having excellent crystallinity, moisture resistance, and shape of a perovskite light absorption layer thin film by doping a perovskite material with an additive to form a light absorption layer has not been recognized.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for manufacturing a perovskite solar cell, includes disposing an electron transport layer on a transparent conductive substrate, disposing an additive-doped perovskite light absorption layer on the electron transport layer, disposing a hole transport layer on the additive-doped perovskite light absorption layer, and disposing an electrode on the hole transport layer. The disposing of the additive-doped perovskite light absorption layer includes adding an additive having hydrophobicity to a perovskite precursor solution, and applying the additive-added perovskite precursor solution onto the electron transport layer to form the additive-doped perovskite light absorption layer.

The additive may include a carboxyl group or dicarboxylic acid anhydride group represented by:

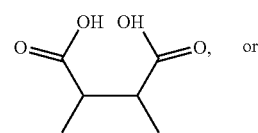

Chemical Formula 1

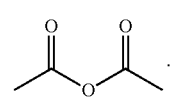

Chemical Formula 2

The additive may promote crystal formation by reacting with the perovskite precursor.

The additive may include one selected from the group consisting of 4,4'-(hexafluoroisopropylidene)diphthalic anhydride, 4,4'-carbonyldiphthalic anhydride, citraconic anhydride, phthalic anhydride, 1,2,4-benzenetricarboxylic anhydride, benzophenone-3,3',4,4'-tetracarboxylic dianhydride, 4,4'-(4,4'-Isopropylidenediphenoxy)bis(phthalic anhydride), 4,4'-oxydiphthalic anhydride, pyromellitic dianhydride, 3,3',4,4'-biphenyltetracarboxylic dianhydride, cyclobutane-1,2,3,4-tetracarboxylic dianhydride, diethyl phthalate, ethylenediaminetetraacetic dianhydride, and combinations thereof.

The applying of the perovskite precursor solution onto the electron transport layer may be performed by a method selected from the group consisting of spin coating, bar coating, nozzle printing, spray coating, slot die coating, gravure printing, inkjet printing, screen printing, electrohydrodynamic jet printing, electrospray, and combinations thereof.

The additive-doped perovskite light absorption layer may each independently include a perovskite material represented by: Chemical Formula 3: RMX$_3$, or Chemical Formula 4: R$_4$MX$_6$, wherein R is an alkali metal or a C$_1$-C$_{24}$ substituted or unsubstituted alkyl group, when R is substituted, the substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion.

The transparent conductive substrate may include one selected from the group consisting of FTO, ITO, IZO, $ZnO-Ga_2O_3$, $ZnO-Al_2O_3$, $SnO_2-Sb_2O_3$, and combinations thereof.

The electron transport layer may include one selected from the group consisting of $TiO_2$, ZrO, $Al_2O_3$, $SnO_2$, ZnO, $WO_3$, $Nb_2O_5$, $TiSrO_3$, and combinations thereof.

The hole transport layer may include one selected from the group consisting of Spiro-OMeTAD, PEDOT:PSS, G-PEDOT, PANI:PSS, PANI:CSA, PDBT, P3HT, PCPDTBT, PCDTBT, PTAA, $MoO_3$, $V_2O_5$, NiO, $WO_3$, CuI, CuSCN, and combinations thereof.

The electrode may include one selected from the group consisting of Au, Ag, Pt, Ni, Cu, In, Ru, Pd, Rh, Mo, Ir, Os, C, a conductive polymer, and combinations thereof.

In another general aspect, a perovskite solar cell includes a transparent conductive substrate, an electron transport layer disposed on the transparent conductive substrate, a hydrophobic additive-doped perovskite light absorption layer disposed on the electron transport layer, a hole transport layer disposed on the hydrophobic additive-doped perovskite light absorption layer, and an electrode disposed on the hole transport layer.

An additive of the hydrophobic additive-doped perovskite light absorption layer may be present on defects of the hydrophobic additive-doped perovskite light absorption layer to stabilize a crystal phase of the hydrophobic additive-doped perovskite light absorption layer.

Non-radiative recombination of electrons and holes may be prevented by the additive in the perovskite light absorption layer.

An additive of the hydrophobic additive-doped perovskite light absorption layer may serve as a passivation in the hydrophobic additive-doped perovskite light absorption layer.

Other features and aspects will be apparent from the following detailed description, the drawings, and the claims.

BRIEF DESCRIPTION OF THE DRAWINGS

The patent or application file contains a least one drawing executed in color. Copies of this patent or patent application publication with color drawing(s) will be provided by the Office upon request and payment of the necessary fee.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
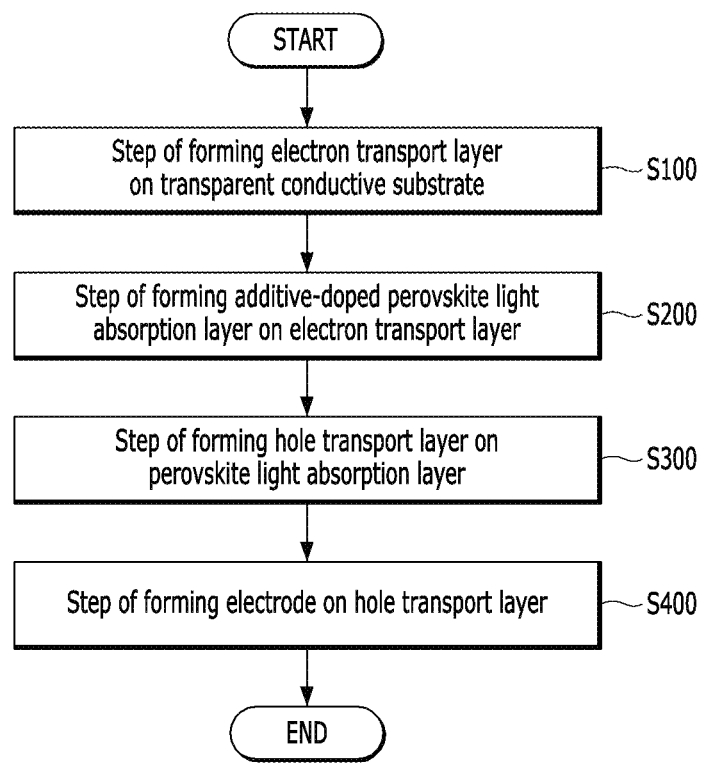
FIG. 1 is a flowchart of a method for manufacturing a perovskite solar cell according to an embodiment of the present application.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

When unique manufacture and material allowable errors of numerical values are suggested to mentioned meanings of terms of degrees used in the present specification such as "about", "substantially", etc., the terms of degrees are used in the numerical values or as a meaning near the numerical values, and the terms of degrees are used to prevent that an unscrupulous infringer unfairly uses a disclosure content in which exact or absolute numerical values are mentioned to help understanding of the present application. Further, throughout the specification of the present application, "a step to do ~" or "a step of ~" does not mean "a step for ~".

Throughout the specification of the present application, a term of "a combination thereof" included in a Markush type expression, which means a mixture or combination of one or more selected from the group consisting of constituent elements described in the Markush type expression, means including one or more selected from the group consisting of the constituent elements.

Hereinafter, a perovskite solar cell according to the present application and a method for manufacturing the same will be described in detail with reference to embodiments, examples, and drawings. However, the present application is not limited to such embodiments, examples, and drawings.

As a technical means for achieving the aforementioned technical tasks, the first aspect of the present application provides a method for manufacturing a perovskite solar cell, including the operations of: forming an electron transport layer on a transparent conductive substrate; forming an additive-doped perovskite light absorption layer on the electron transport layer; forming a hole transport layer on the perovskite light absorption layer; and forming an electrode on the hole transport layer, in which the operation of forming the perovskite light absorption layer on the electron transport layer includes the operations of: adding an additive having hydrophobicity to a perovskite precursor solution; and applying the additive-added perovskite precursor solution onto the electron transport layer to form the additive-doped perovskite light absorption layer.

FIG. 1 is a flowchart of a method for manufacturing a perovskite solar cell according to an embodiment of the present application.

First, the electron transport layer is formed on the transparent conductive substrate (S100).

According to an embodiment of the present application, although the operation of applying the perovskite precursor solution onto the electron transport layer may be performed by a method selected from the group consisting of spin coating, bar coating, nozzle printing, spray coating, slot die coating, gravure printing, inkjet printing, screen printing, electrohydrodynamic jet printing, electrospray, and combinations thereof, the present application is not limited thereto.

Subsequently, the additive-doped perovskite light absorption layer is formed on the electron transport layer (S200)

Figure 2:
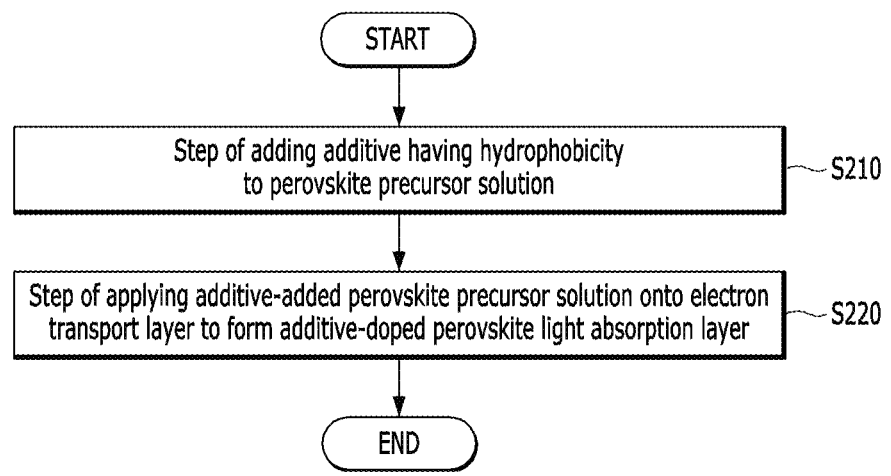
FIG. 2 is a flowchart of an operation of forming a perovskite light absorption layer in a method for manufacturing a perovskite solar cell according to an embodiment of the present application.

FIG. 2 is a flowchart of an operation of forming a perovskite light absorption layer in a method for manufacturing a perovskite solar cell according to an embodiment of the present application.

In the operation of forming the perovskite light absorption layer, an additive having hydrophobicity is first added to the perovskite precursor solution (S210).

Subsequently, the additive-added perovskite precursor solution is applied to the electron transport layer to form the additive-doped perovskite light absorption layer (S220).

As will be described later, since the perovskite solar cell, according to the present application, includes the perovskite light absorption layer doped with the additive having hydrophobicity, it has excellent moisture resistance.

Although there has been a problem that a conventional perovskite solar cell cannot maintain the initial power conversion efficiency since it is sensitive to moisture, the perovskite solar cell, according to the present application, may overcome such a decrease in power conversion efficiency since it is excellent in moisture resistance.

According to an embodiment of the present application, although the additive may include a carboxyl group or dicarboxylic acid anhydride group structure represented by the following Chemical Formula 1 or Chemical Formula 2, the present application is not limited thereto:

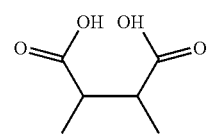

[Chemical Formula 1]

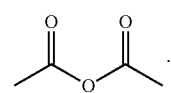

[Chemical Formula 2]

The additive has an excellent reaction with the material essentially included in the perovskite precursor material. As will be described later, the perovskite material may be represented by Chemical Formula 3 ($RMX_3$) or Chemical Formula 4 ($R_4MX_6$) below, the additive strongly interacts with materials at the M site and the X site of the perovskite material to form a Lewis adduct, and this is achieved by the additive having a structure represented by Chemical Formula 1 and/or Chemical Formula 2 above.

Specifically, the structure represented by Chemical Formula 1 or Chemical Formula 2 above has an electron donating effect to the extent that it can efficiently react with the material at the M site and the X site by including a resonance structure.

According to the present application, the additive acts as a Lewis base in the method for manufacturing a perovskite solar cell. In this regard, the reaction forming the Lewis adduct corresponds to a Lewis acid-base reaction, in which the additive reacts with a cation-bearing (high acidity) M site material. Moreover, it has an appropriate level of basicity capable of reacting strongly with a generally anion-bearing (low acidity) X site material. Accordingly, the Lewis adduct formed by adding the additive to the perovskite precursor material may be included in the perovskite material crystal.

According to an embodiment of the present application, although the additive may promote crystal formation by reacting with the perovskite precursor, the present application is not limited thereto.

According to the present application, a method for manufacturing a perovskite solar cell may form a cross-linked structure by doping the additive so that the additive reacts with the perovskite precursor. Accordingly, the method for manufacturing the perovskite solar cell according to the present application has an advantage that it may provide a perovskite solar cell which may suppress the formation of the defects of the light absorber thin film by adding an organic thin film, and may significantly improve stability by reducing the trap density by connecting the crystals to each other.

The crystallinity and photoelectric properties of the perovskite thin film manufactured by aging the perovskite precursor solution in the method for manufacturing the perovskite solar cell may be improved. However, since a secondary phase (δ-phase) is formed when the aging time is prolonged in the conventional method, there has been a problem in that performance of the perovskite solar cell manufactured is reduced.

On the other hand, in the method for manufacturing the perovskite solar cell according to the present application, it is possible to increase the stability of the perovskite precursor solution aged through an interaction between the perovskite and the additive by adding the additive to the perovskite precursor solution, and it is possible to form an α-phase that is a stable phase without forming an δ-phase that is an unstable phase through this.

Further, the method for manufacturing the perovskite solar cell according to the present application has an advantage that it may provide an excellent durable perovskite thin film with a stable α-phase through the hydrogen bonding of F—HN possessed by a thin film-doped material of the perovskite light absorption layer and the lead chelation of F—Pb or O—Pb of the perovskite.

Further, the additive is included in the perovskite light absorption layer, and the perovskite light absorption layer, including the additive, is capable of effective charge transfer.

According to an embodiment of the present application, although the additive may include one selected from the group consisting of 4,4'-(hexafluoroisopropylidene)diphthalic anhydride, 4,4'-carbonyldiphthalic anhydride, citraconic anhydride, phthalic anhydride, 1,2,4-benzenetricarboxylic anhydride, benzophenone-3,3',4,4'-tetracarboxylic dianhydride, 4,4'-(4,4'-lsopropylidenediphenoxy)bis(phthalic anhydride), 4,4'-oxydiphthalic anhydride, pyromellitic dianhydride, 3,3',4,4'-biphenyltetracarboxylic dianhydride, cyclobutane-1,2,3,4-tetracarboxylic dianhydride, diethyl phthalate, ethylenediaminetetraacetic dianhydride, and combinations thereof, the present application is not limited thereto.

According to an embodiment of the present application, although the perovskite light absorption layer may each independently include a perovskite material represented by the following Chemical Formula 3 or Chemical Formula 4, the present application is not limited thereto:

$$RMX_3 \quad \text{[Chemical Formula 3]}$$

$$R_4MX_6. \quad \text{[Chemical Formula 4]}$$

In Chemical Formula 3 and Chemical Formula 4 above, R is an alkali metal or a $C_1$-$C_{24}$ substituted or unsubstituted alkyl group; when R is substituted, the substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion.

Subsequently, the hole transport layer is formed on the perovskite light absorption layer (S300).

Subsequently, the electrode is formed on the hole transport layer (S400).

According to an embodiment of the present application, although the transparent conductive substrate may include one selected from the group consisting of FTO, ITO, IZO, ZnO—$Ga_2O_3$, ZnO—$Al_2O_3$, $SnO_2$—$Sb_2O_3$, and combinations thereof, the present application is not limited thereto.

According to an embodiment of the present application, although the electron transport layer may include one selected from the group consisting of $TiO_2$, ZrO, $Al_2O_3$, $SnO_2$, ZnO, $WO_3$, $Nb_2O_5$, $TiSrO_3$, and combinations thereof, the present application is not limited thereto.

According to an embodiment of the present application, although the hole transport layer may include one selected from the group consisting of Spiro-OMeTAD, PEDOT:PSS, G-PEDOT, PANI:PSS, PANI:CSA, PDBT, P3HT, PCPDTBT, PCDTBT, PTAA, $MoO_3$, $V_2O_5$, NiO, $WO_3$, CuI, CuSCN, and combinations thereof, the present application is not limited thereto.

According to an embodiment of the present application, although the electrode may include one selected from the group consisting of Au, Ag, Pt, Ni, Cu, In, Ru, Pd, Rh, Mo, Ir, Os, C, a conductive polymer, and combinations thereof, the present application is not limited thereto.

The second aspect of the present application provides a perovskite solar cell including: a transparent conductive substrate; an electron transport layer formed on the transparent conductive substrate; a hydrophobic additive-doped perovskite light absorption layer formed on the electron transport layer; a hole transport layer formed on the perovskite light absorption layer; and an electrode formed on the hole transport layer.

With respect to the perovskite solar cell according to the second aspect of the present application, although detailed descriptions of parts overlapping with the first aspect of the present application have been omitted, the contents described in the first aspect of the present application may be equally applied to the second aspect of the present application even if the descriptions have been omitted.

According to an embodiment of the present application, although the additive may be present on the defects of the perovskite light absorption layer to stabilize the crystal phase of the perovskite light absorption layer, the present application is not limited thereto.

In this regard, the perovskite solar cell, according to the present application, allows the additive to be doped so that the crystal phase of the perovskite light absorption layer exists as a stable phase (α-phase), and a secondary phase (δ-phase) that is an unstable phase is hardly included. Further, according to the present application, the perovskite solar cell allows the grain size of the crystal of the perovskite light absorption layer to be increased to improve crystallinity by including the additive.

According to an embodiment of the present application, although the additive may serve as passivation in the perovskite light absorption layer, the present application is not limited thereto.

In this regard, in the perovskite solar cell, according to the present application, moisture resistance and crystal stability may be improved by performing a doping process on the defects, including an anion vacancy, a cation vacancy, grains, etc.

Specifically, since the additive is doped on the perovskite light absorption layer, the perovskite solar cell, according to the present application, has an excellent effect of blocking from moisture to maintain high power conversion efficiency even in a high humidity environment.

According to an embodiment of the present application, although the additive may prevent non-radiative recombination of electrons and holes in the perovskite light absorption layer, the present application is not limited thereto.

When there are many defects within the element in driving a solar cell element, electrons and holes do not recombine by receiving the original light due to non-radiative recombination, and a loss occurs in the electron-hole pair that should be used for power generation, and the power conversion efficiency of the element is reduced due to this.

In this regard, in the perovskite solar cell, according to the present application, the non-radiative recombination of the electrons and holes is prevented by the additive in the perovskite light absorption layer so that the power conversion efficiency of the element may be increased.

Further, the perovskite solar cell according to the present application may obtain an excellent durable perovskite thin film with a stable α-phase through the hydrogen bonding of F—HN possessed by the thin film-doped material of the perovskite light absorption layer and the lead chelation of F—Pb or O—Pb of the perovskite.

Hereinafter, although the present disclosure will be described in more detail through examples, the following examples are for illustrative purposes only and are not intended to limit the scope of the present application.

[Example 1] Manufacturing of Perovskite Solar Cell Doped with FDA (CDA) Additive An electron transport layer was formed by coating a metal oxide on a glass substrate. Subsequently, the wettability of the substrate was increased by forming a hydrophilic group on the surface of the oxide-coated substrate by performing ultrasonic cleaning and UV/Ozone treatment of an oxide-coated substrate for 15 minutes each in distilled water, ethanol, and acetone. Meanwhile, a 2 M aqueous $TiCl_4$ solution was stored at −4° C. to maintain stability. Then, $TiO_2$ was deposited on the substrate by a chemical bath deposition (CBD) method, and the substrate was immersed in a 0.18 M aqueous $TiCl_4$ solution and dried at 70° C. for 45 minutes. Subsequently, the substrate was repeatedly washed with distilled water and ethanol three times to completely remove residues on the surface of the substrate, heat-treated at 200° C. for 1 hour, and cooled at room temperature.

Subsequently, 0.263 g of FAI, 0.009 g of MABr, 0.726 g of $PbI_2$, 0.029 g of $PbBr_2$, and 0.035 g of MACl were dissolved in 1 mL of DMSO/DMF (8/1, v/v) in order to form a 1.6 M perovskite precursor solution with a composition of $(FAPbI_3)_{0.95}(MAPbBr_3)_{0.05}$. Subsequently, FDA was added to the solution at concentrations of 0.025%, 0.05%, 0.1%, and 0.2%, respectively to form a perovskite precursor solution to which additives in 4 concentrations were added.

Subsequently, a $TiO_2$/oxide glass substrate was first subjected to UV/Ozone treatment for 15 minutes, and the perovskite precursor solution was applied onto the substrate through spin coating (5,000 rpm, 25 seconds). After 20 seconds of starting the spin coating process, 0.55 ml of ether was rapidly dropped. A translucent thin film produced in this way was heated at 150° C. for 10 minutes to obtain a high-density perovskite thin film (an additive-doped perovskite light absorption layer).

Subsequently, after cooling the substrate that had undergone all of the foregoing processes at room temperature, a hole transport material solution in which 90 mg of spiro-OMeTAD, 36 μL of 4-tert-butyl pyridine, 520 mg/mL of lithium bis(trifluoromethylsulfonyl)imide, and 23 μL of acetonitrile had been dissolved in 1 ml of chlorobenzene was prepared, and the hole transport material solution was spin-coated on the light absorption layer to form a hole transport layer.

Subsequently, an electrode was formed by depositing gold or silver to 50 nm or more at a rate of 0.4 Å/s and a pressure of $10^{-6}$ torr using a sputtering method.

[Example 2] Manufacturing of CDA Additive-Doped Perovskite Solar Cell

All processes were carried out in the same manner as in Example 1. However, CDA was used instead of FDA when preparing the perovskite precursor solution.

Experimental Example 1

Color changes before and after doping FDA and CDA on the perovskite precursor were observed.

Figure 3:
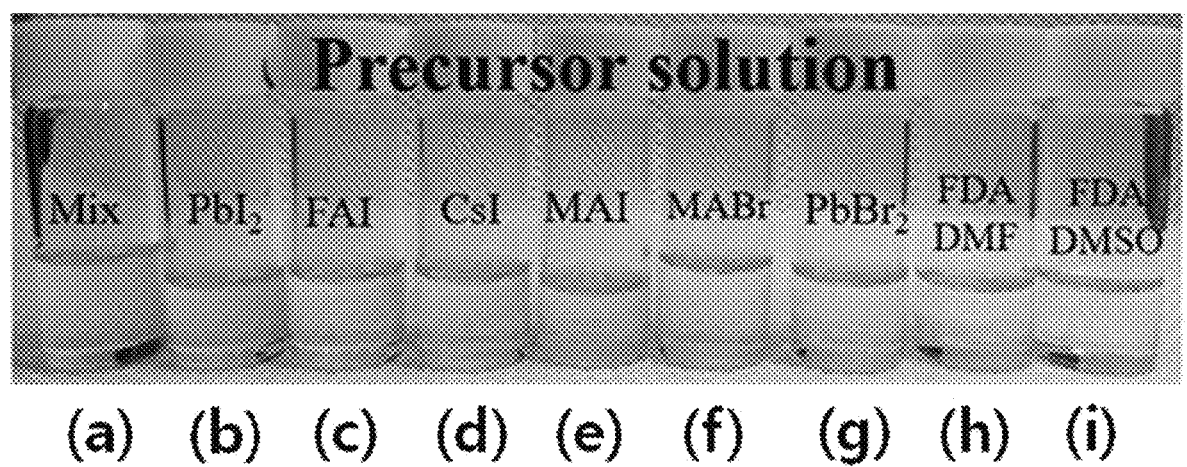
FIG. 3 is a photograph of samples for manufacturing a perovskite light absorption layer according to an embodiment of the present application.

FIG. 3 is a photograph of samples for manufacturing a perovskite light absorption layer according to an embodiment of the present application.

(a) of FIG. 3 is a mixed solution of (b) to (g) and is a perovskite precursor solution before adding additives, (b) to (g) are samples for preparing a perovskite material, and (h) and (j) are the additives.

Figure 4:
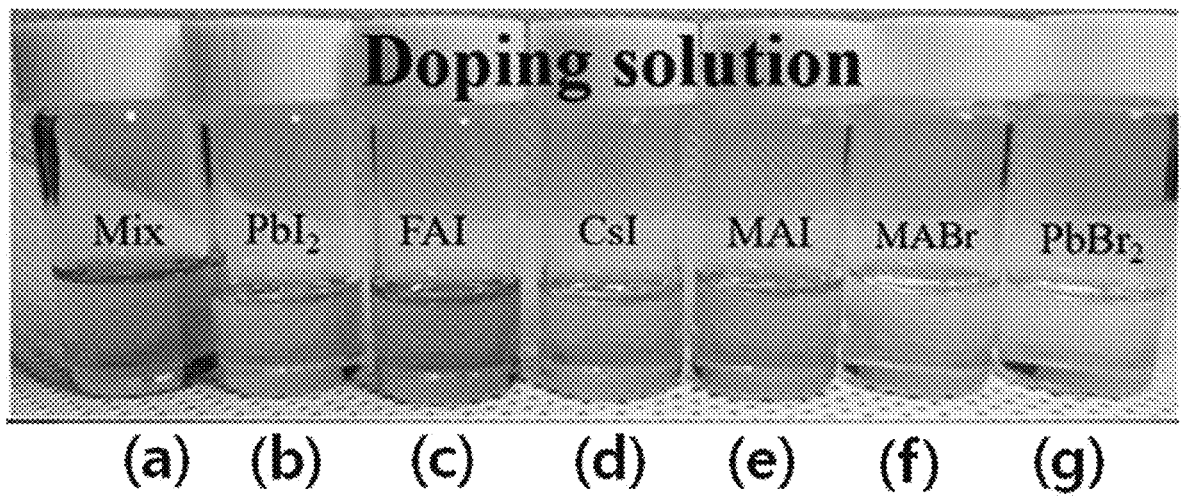
FIG. 4 is a photograph of samples for manufacturing a perovskite light absorption layer according to an embodiment of the present application.

FIG. 4 is a photograph of samples for manufacturing a perovskite light absorption layer according to an embodiment of the present application.

(a) to (g) of FIG. 4 are photographs of samples immediately after adding (h) of FIG. 3 to (a) to (g) solutions of FIG. 3. Desirably, (a) of FIG. 4 is a sample corresponding to the perovskite precursor solution to which the additive is added.

Figure 5:
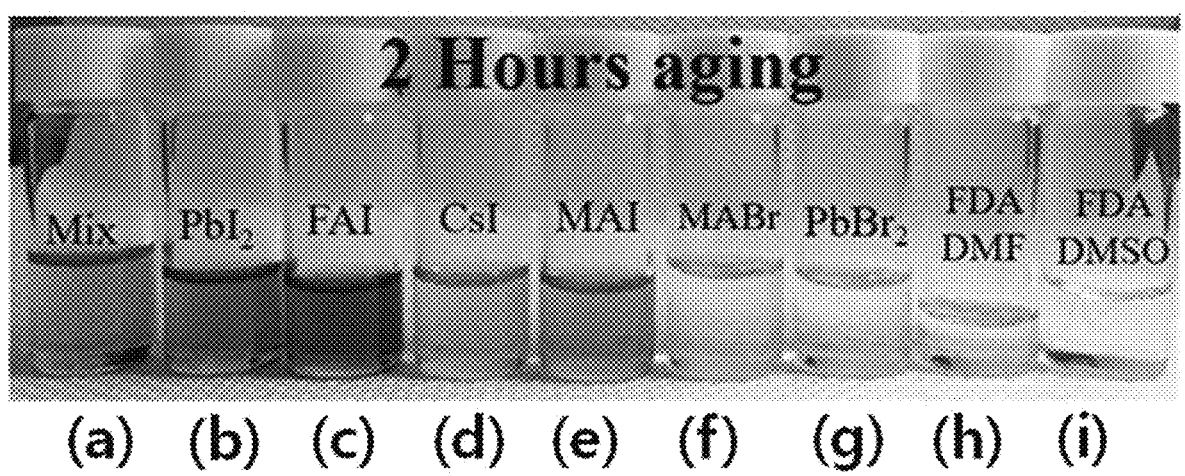
FIG. 5 is a photograph of samples for manufacturing a perovskite light absorption layer according to an embodiment of the present application.

(a) to (g) of FIG. 5 are states after 2 hours of the samples of (a) to (g) of FIG. 4. (f) and (i) indicate that the additive is colorless and transparent.

Figure 6:
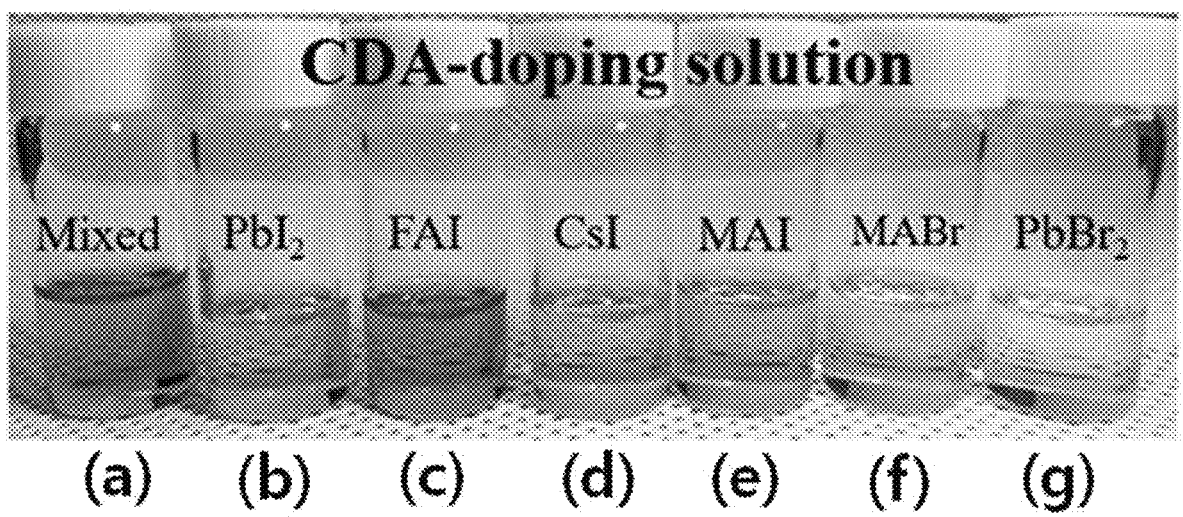
FIG. 6 is a photograph of samples for manufacturing a perovskite light absorption layer according to an embodiment of the present application.

(a) to (g) of FIG. 6 are photographs of samples immediately after adding (i) of FIG. 3 to the (a) to (g) solutions of FIG. 3. Desirably, (a) of FIG. 5 is a sample corresponding to the perovskite precursor solution to which the additive is added.

Figure 7:
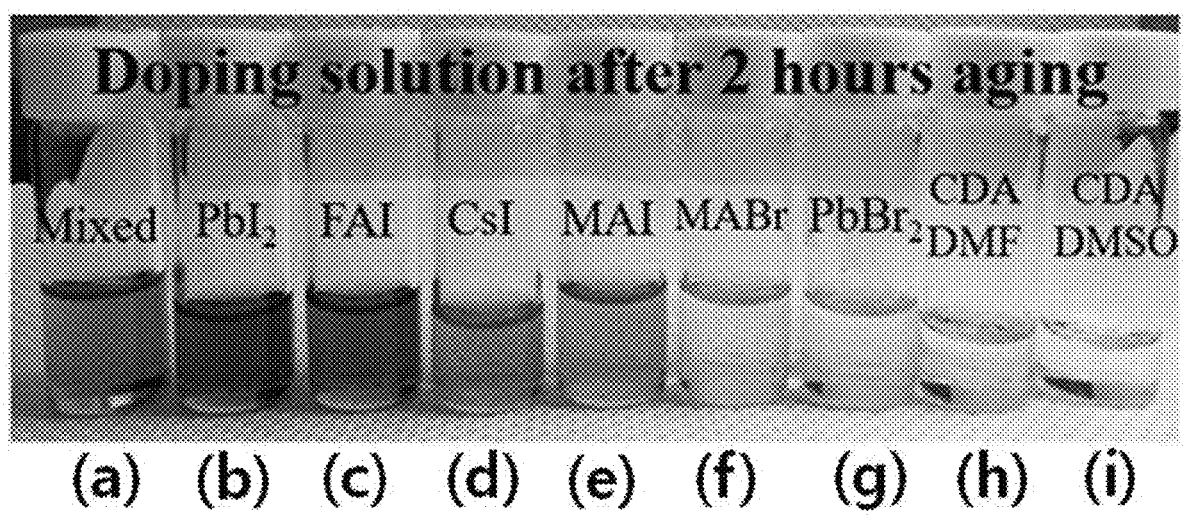
FIG. 7 is a photograph of samples for manufacturing a perovskite light absorption layer according to an embodiment of the present application.

(a) to (g) of FIG. 7 are states after 2 hours of the samples of (a) to (g) of FIG. 6. (f) and (i) indicate that the additive is colorless and transparent.

Referring to FIGS. 4 to 7, colors are changed when an additive (FDA or CDA) is added to the perovskite precursor, and this is a result of forming a Lewis adduct by allowing $Pb^{2+}$ and $I^-$ ion vacancies of the perovskite precursor to strongly interact with the additive by the Lewis acid-base theory. The additive corresponds to a doping material for doping the perovskite material.

Experimental Example 2

Differences in the perovskite light absorption layers with or without additive doping were compared with respect to Examples 1 (0.1% FDA), Example 2 (0.1% CDA), and Comparative Example.

Figure 8:
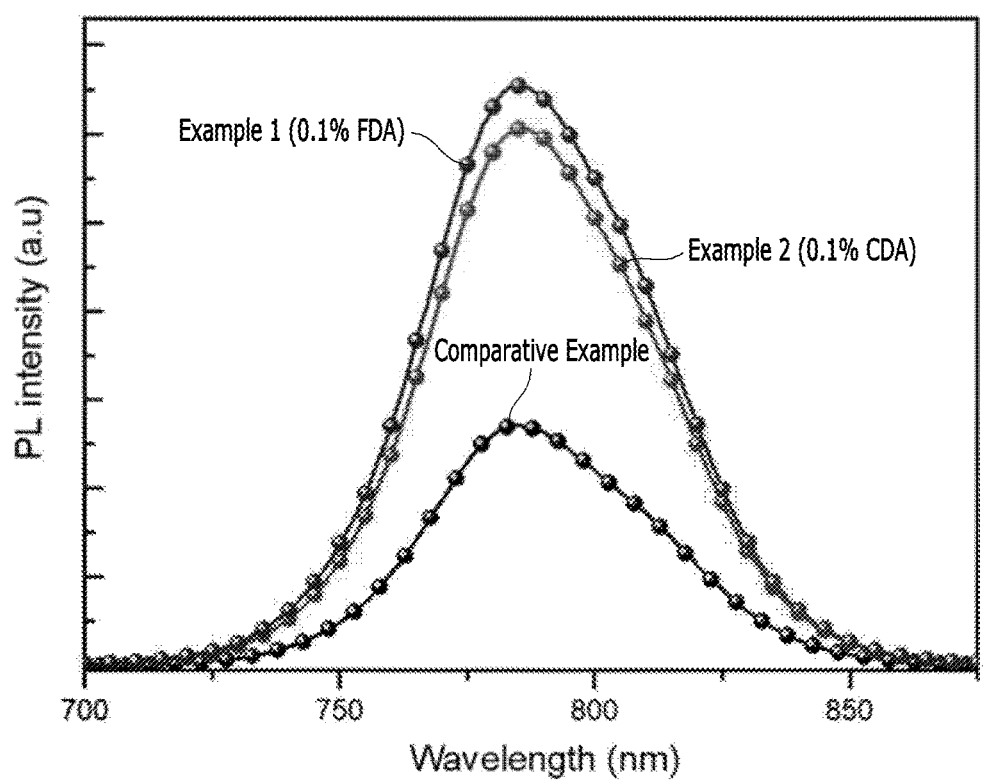
FIG. 8 is a graph showing effects according to additive doping of a perovskite solar cell according to an embodiment of the present application.

FIG. 8 is a graph showing effects according to additive doping of a perovskite solar cell according to an embodiment of the present application. The x-axis represents wavelength, and the y-axis represents the intensity of fluorescence.

Referring to FIG. 8, it can be confirmed that the fluorescence intensity is increased by up to 250% and up to 210% respectively in Examples 1 and 2 compared to Comparative Example, and it can be confirmed through this that the perovskite thin film is passivated by the production of the Lewis adduct.

FIGS. 9 to 12 are graphs showing the improvement of photovoltaic parameters according to additive doping of the perovskite solar cell according to an embodiment of the present application.

Short-circuit current density ($J_{sc}$), open-circuit voltage ($V_{oc}$), fill factor (FF), and power conversion efficiency (PCE) as the photovoltaic parameters were analyzed.

Figure 9:
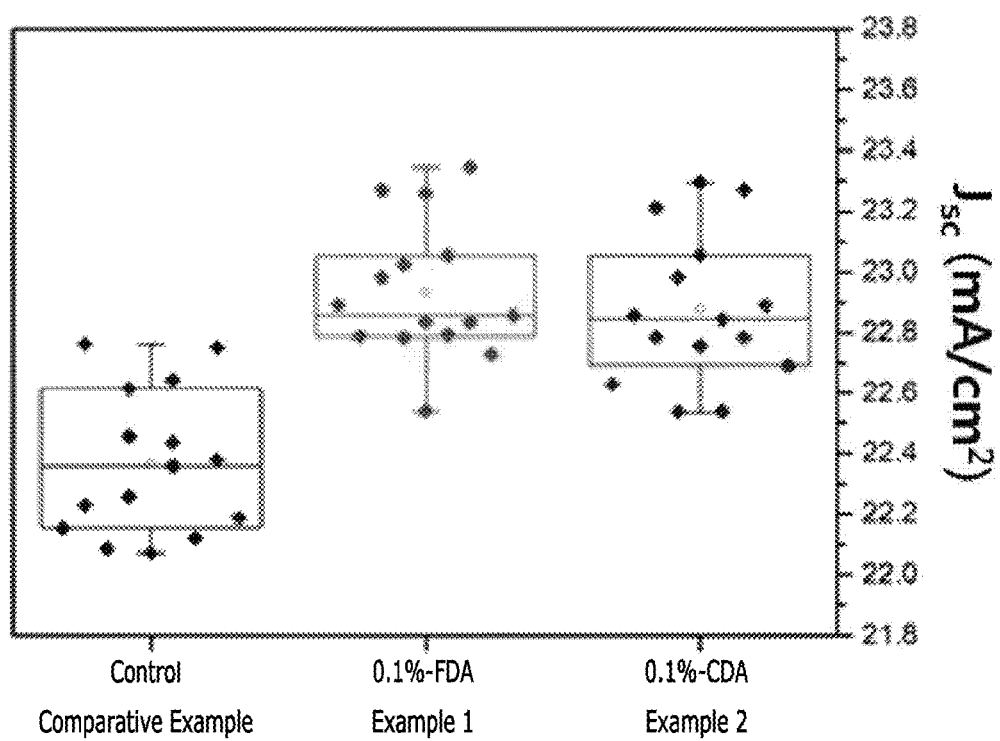
FIG. 9 is a graph showing short-circuit current densities with or without additive doping of the perovskite solar cells according to Examples and Comparative Example of the present application.

FIG. 9 is a graph showing short-circuit current densities with or without additive doping of the perovskite solar cells according to Examples and Comparative Example of the present application.

Referring to FIG. 9, the average short-circuit current density of Comparative Example is 22.3636±0.2122 mA/cm², and the average short-circuit current densities of Example 1 and Example 2 are 23.4578±0.3023 mA/cm² and 23.033±0.3516 mA/cm²¹ respectively. Compared to Comparative Example, the average short-circuit current densities have been increased in Example 1 and Example 2 doped with the additive.

Figure 10:
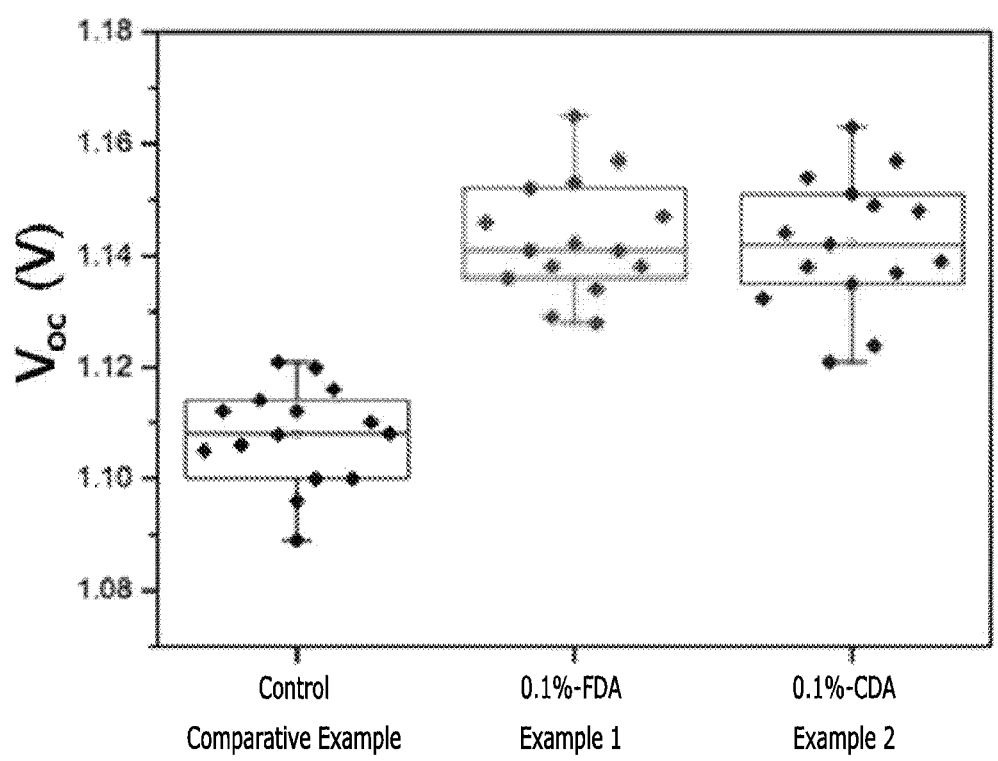
FIG. 10 is a graph showing open-circuit voltages with or without additive doping of the perovskite solar cells according to Examples and Comparative Example of the present application.

FIG. 10 is a graph showing open-circuit voltages with or without additive doping of the perovskite solar cells according to Examples and Comparative Example of the present application.

Referring to FIG. 10, the open-circuit voltage of Comparative Example is 1.1136±0.0091 V, and the open-circuit voltages of Examples 1 and 2 are 1.150 κ 0.0084 V and 1.149±0.0079 V, respectively. The open-circuit voltages have been increased in Examples 1 and 2 doped with the additive compared to Comparative Example.

Figure 11:
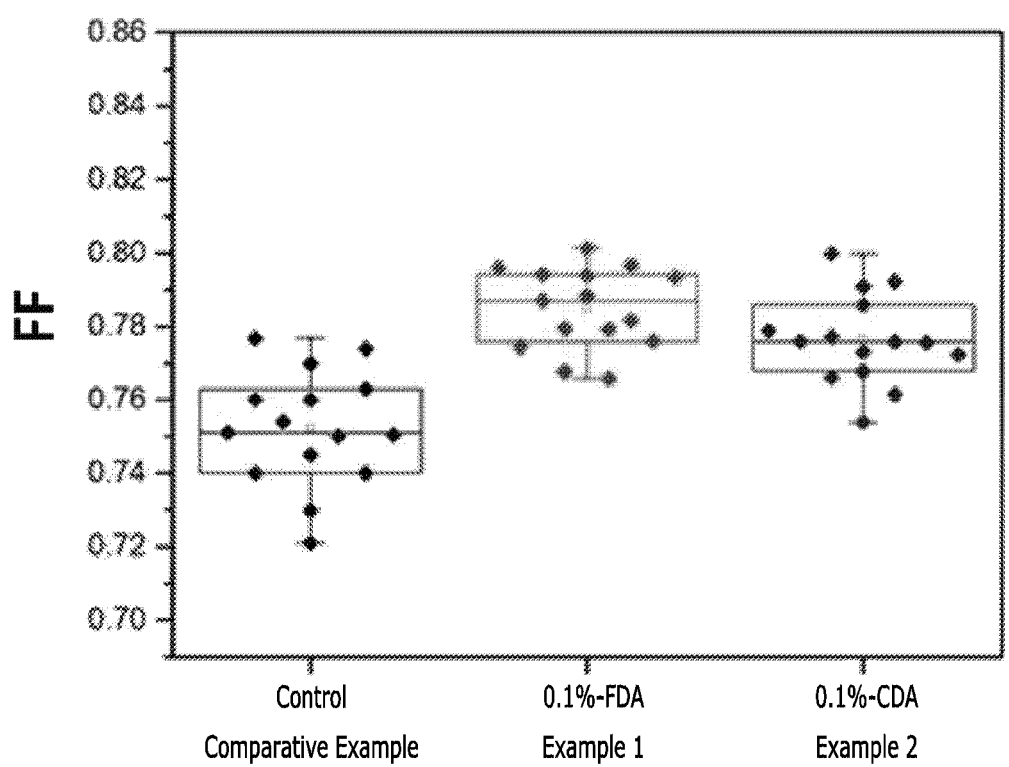
FIG. 11 is a graph showing fill factors with or without additive doping of the perovskite solar cells according to Examples and Comparative Example of the present application.

FIG. 11 is a graph showing fill factors with or without additive doping of the perovskite solar cells according to Examples and Comparative Example of the present application.

Referring to FIG. 11, the fill factor of Comparative Example is 0.7617±0.0145%, and the fill factors of Examples 1 and 2 are 0.805±0.009 and 0.7982±0.011, respectively. The fill factors have been increased in Examples 1 and 2 doped with the additive compared to Comparative Example.

Figure 12:
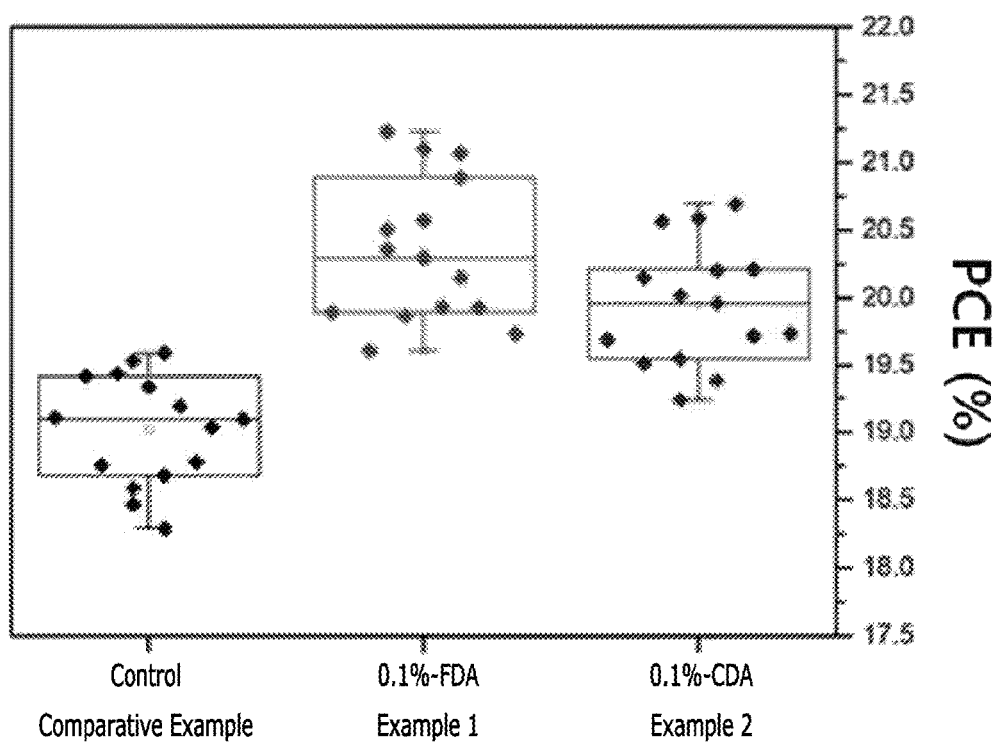
FIG. 12 is a graph showing power conversion efficiencies with or without additive doping of the perovskite solar cells according to Examples and a Comparative Example of the present application.

FIG. 12 is a graph showing power conversion efficiencies with or without additive doping of the perovskite solar cells according to Examples and Comparative Example of the present application.

Referring to FIG. 12, Comparative Example's normalized power conversion efficiency is 18.9724±0.4035%, and the normalized power conversion efficiencies of Examples 1 and 2 are 21.7093±0.4314% 21.1331±0.4023%, respectively. Thus, it can be confirmed that the normalized power conversion efficiencies have been remarkably improved.

Experimental Example 3

In Example 1, Example 2, and Comparative Example, phase changes and grain sizes with or without addition and concentration of the additive were confirmed.

Figure 13:
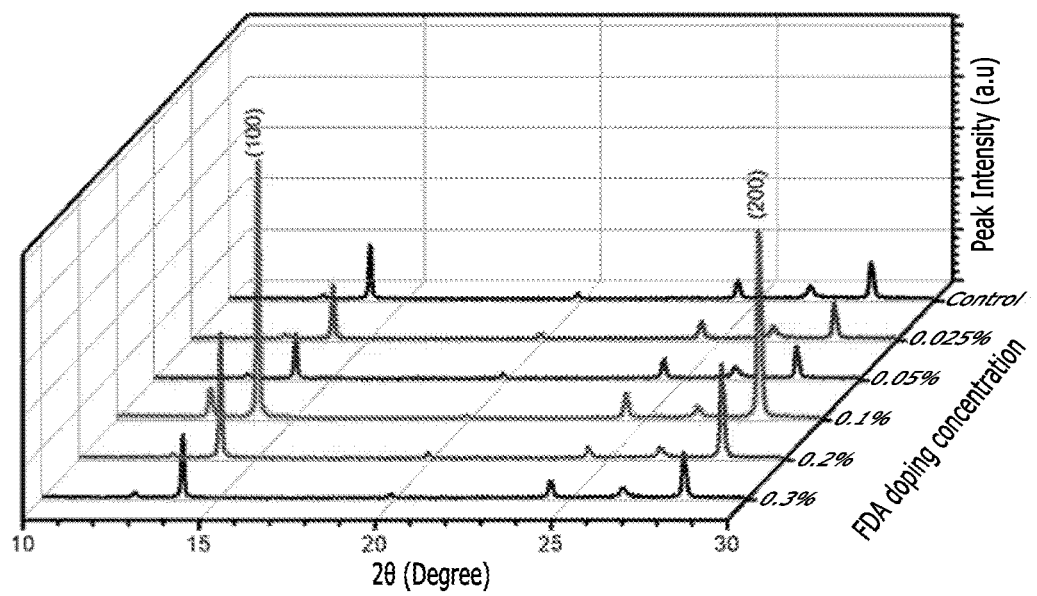
FIG. 13 is a graph showing phase changes when an FDA additive is added at various concentrations in a method for manufacturing the perovskite solar cells according to Examples and a Comparative Example of the present application.

FIG. 13 is a graph showing phase changes when an FDA additive is added at various concentrations in a method for manufacturing the perovskite solar cells according to Examples and Comparative Example of the present application.

Figure 14:
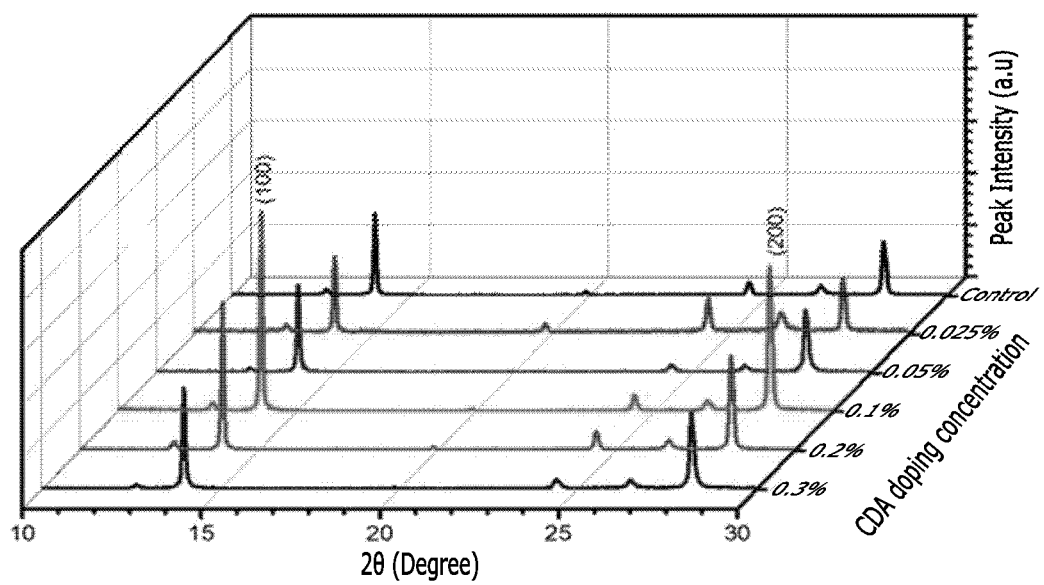
FIG. 14 is a graph showing phase changes when a CDA additive is added at various concentrations in a method for manufacturing the perovskite solar cells according to Examples and a Comparative Example of the present application.

FIG. 14 is a graph showing phase changes when a CDA additive is added at various concentrations in a method for manufacturing the perovskite solar cells according to Examples and Comparative Example of the present application.

Referring to FIGS. 13 and 14, when doping the additive, it can be confirmed that a diffraction peak of the secondary phase (δ-phase), which is an unstable phase at all concentrations, does not exist, and it can also be confirmed that the perovskite material structure does not change depending on the additive concentration. Specifically, diffraction peaks in the (100) and (200) directions may be mainly observed at about 14.0° and about 28.26°, and it may be observed that, when the additive concentration is increased to 0.1%, the diffraction signal in the (110) direction gradually increases, and then rapidly decreases again at the concentration of 0.1% or more. Thus, it can be confirmed that the crystallinity of the light absorption layer of the perovskite is improved as the diffraction signal in the (110) direction increases. Further, it can be seen that the full width at half maximum (FWHM) of the diffraction signal in the (110) direction decreases as the additive doping concentration increases.

As a result of calculating the grain size by the Scherrer formula (Equation 1) using the results of FIGS. 13 and 14, the grain size of Comparative Example is 73.6 nm, whereas the grain sizes of Examples 1 and 2 are 92.3 nm and 89.2 nm respectively. In the case of doping the additive, it can be confirmed that the grains have grown larger, that is, the crystallinity has been improved.

$$D = \frac{k\lambda}{\beta\cos\theta} \quad \text{[Equation 1]}$$

In Equation 1, D is a grain size, k is a Scherrer constant (~0.9), λ is a radius of curvature, and β is a full width at half maximum (FWHM).

Figure 15:
FIG. 15 is a field emission scanning electron microscope (FESEM) image of the upper surface of the perovskite light absorption layer thin film according to Comparative Example of the present application.

FIG. 15 is a field emission scanning electron microscope (FESEM) image of the upper surface of the perovskite light absorption layer thin film according to Comparative Example of the present application.

Figure 16:
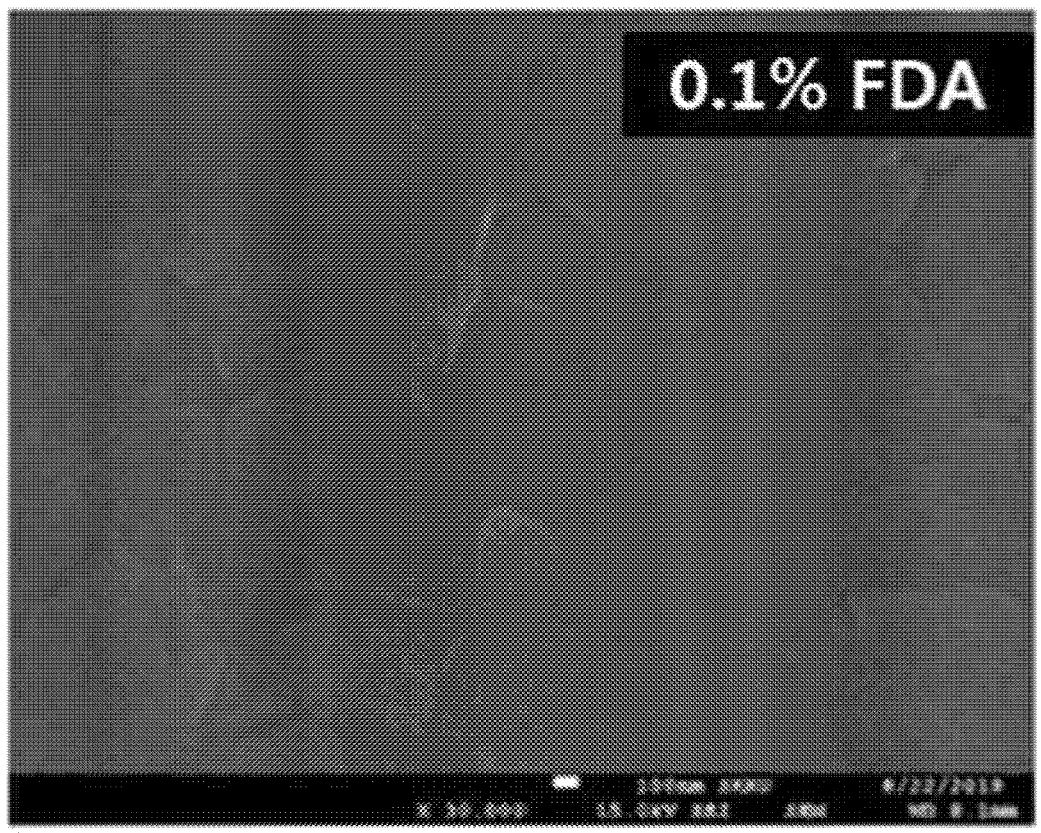
FIG. 16 is a field emission scanning electron microscope (FESEM) image of the upper surface of the perovskite light absorption layer thin film according to Example 1 of the present application.

FIG. 16 is a field emission scanning electron microscope (FESEM) image of the upper surface of the perovskite light absorption layer thin film according to Example 1 of the present application.

Figure 17:
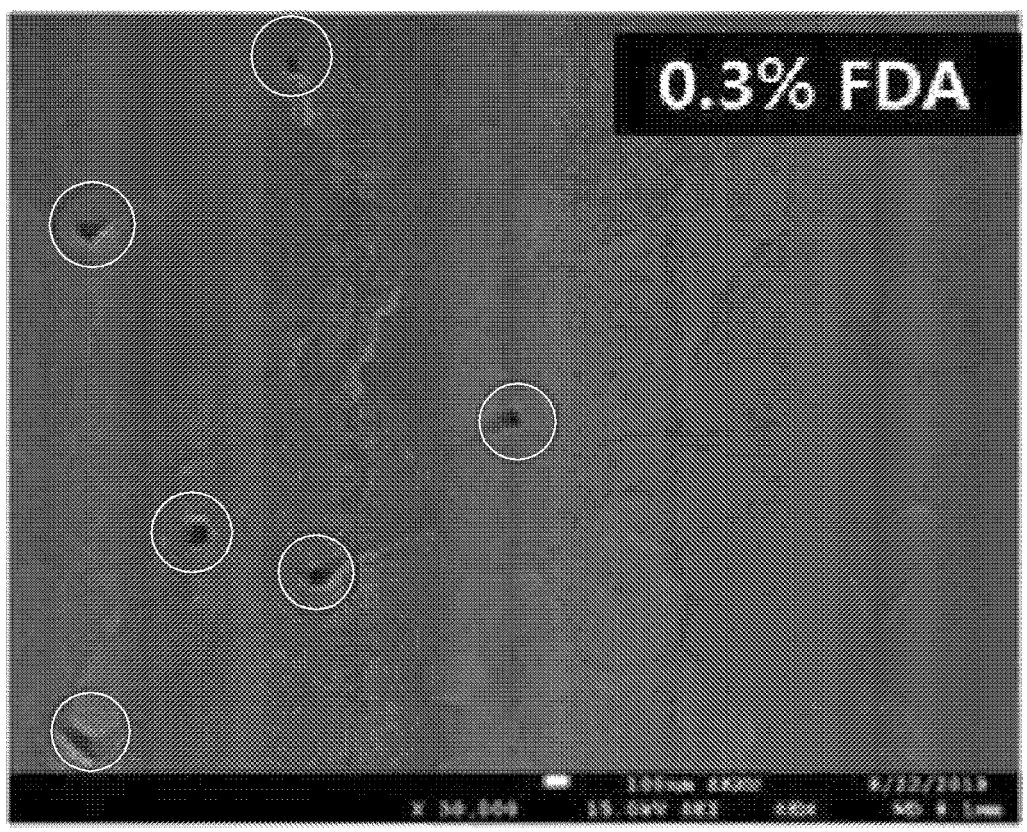
FIG. 17 is a field emission scanning electron microscope (FESEM) image of the upper surface of the perovskite light absorption layer thin film according to Example 1 of the present application.

FIG. 17 is a field emission scanning electron microscope (FESEM) image of the upper surface of the perovskite light absorption layer thin film according to Example 1 of the present application.

Figure 18:
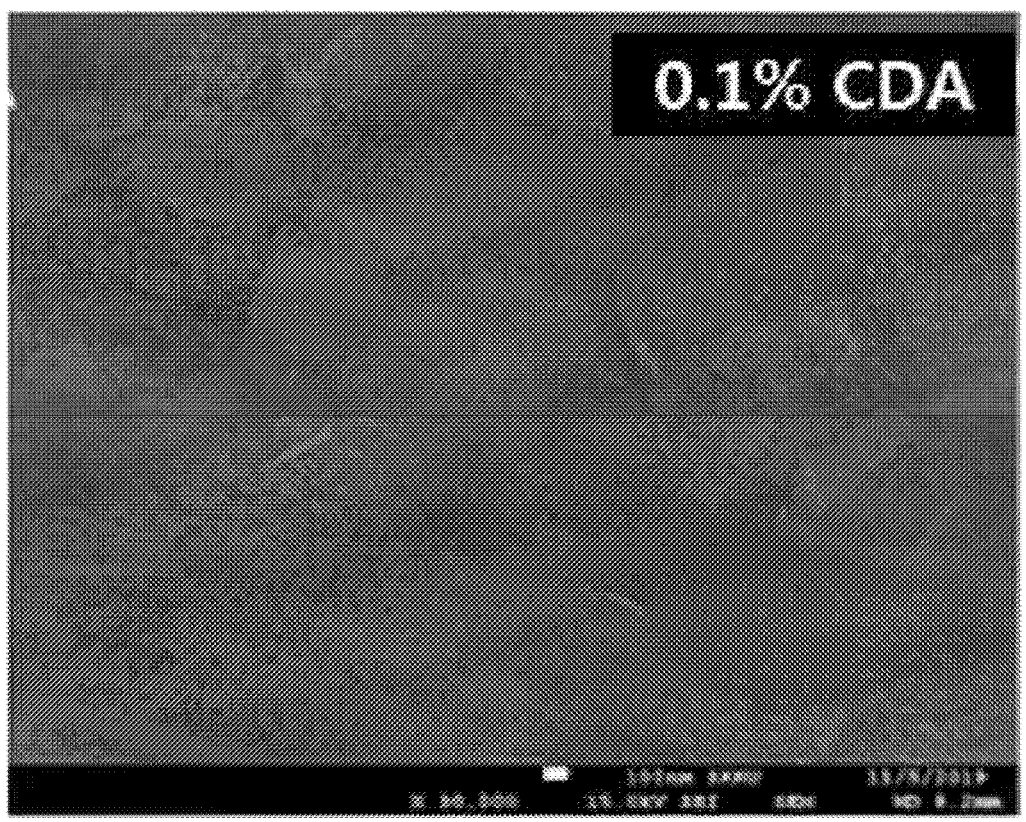
FIG. 18 is a field emission scanning electron microscope (FESEM) image of the upper surface of the perovskite light absorption layer thin film according to Example 2 of the present application.

FIG. 18 is a field emission scanning electron microscope (FESEM) image of the upper surface of the perovskite light absorption layer thin film according to Example 2 of the present application.

Figure 19:
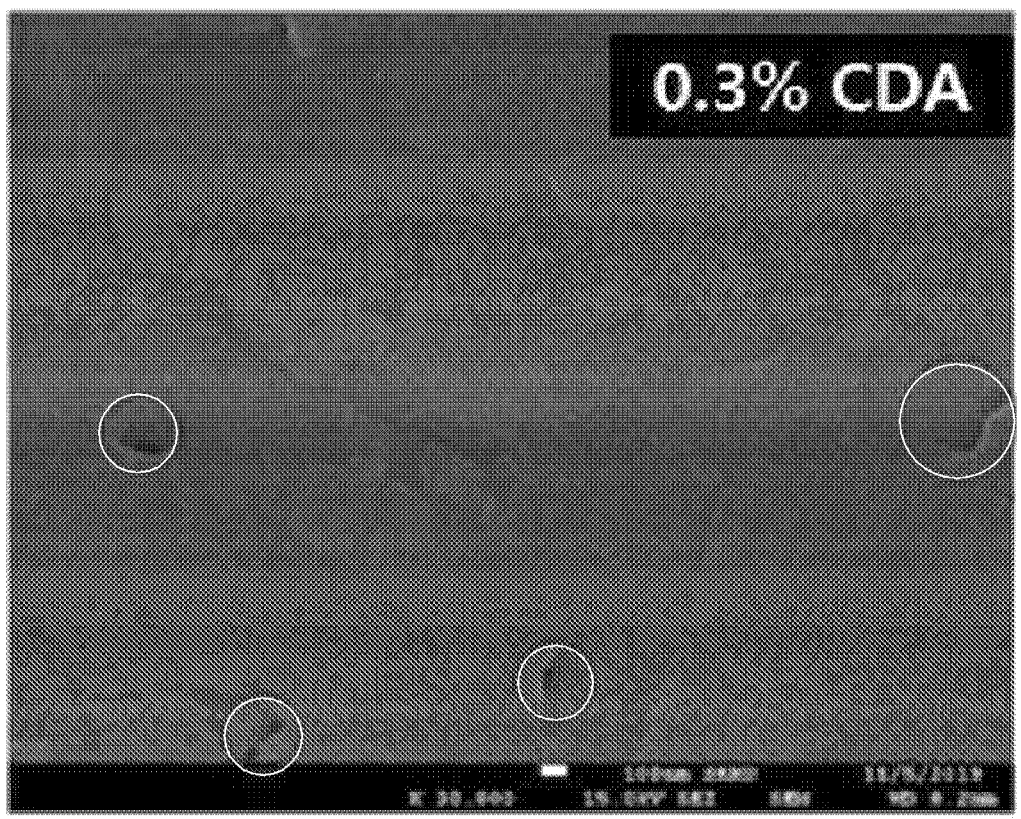
FIG. 19 is a field emission scanning electron microscope (FESEM) image of the upper surface of the perovskite light absorption layer thin film according to Example 2 of the present application.

FIG. 19 is a field emission scanning electron microscope (FESEM) image of the upper surface of the perovskite light absorption layer thin film according to Example 2 of the present application.

Figure 20:
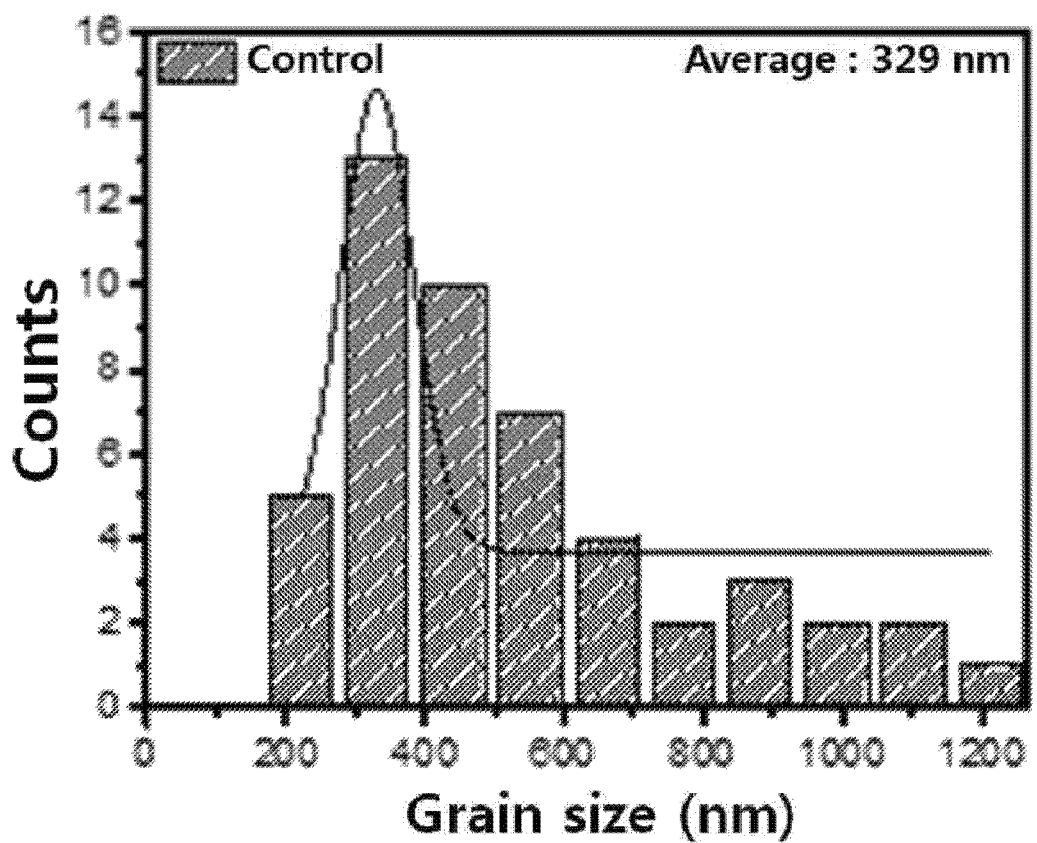
FIG. 20 is a result of calculating the grain size by analyzing the image of FIG. 15 with software (Nano Measurer 1.2) in the perovskite light absorption layer thin film according to Comparative Example of the present application.

FIG. 20 is a result of calculating the grain size by analyzing the image of FIG. 15 with software (Nano Measurer 1.2) in the perovskite light absorption layer thin film according to Comparative Example of the present application.

Referring to FIG. 20, the perovskite light absorption layer thin film, according to Comparative Example has grains with a size of about 329 nm on average.

Taken together, it can be seen through Experimental Example 3 that, when doping the additive, the grain size of the perovskite light absorption layer thin film increases, and the phase is stabilized.

Figure 21:
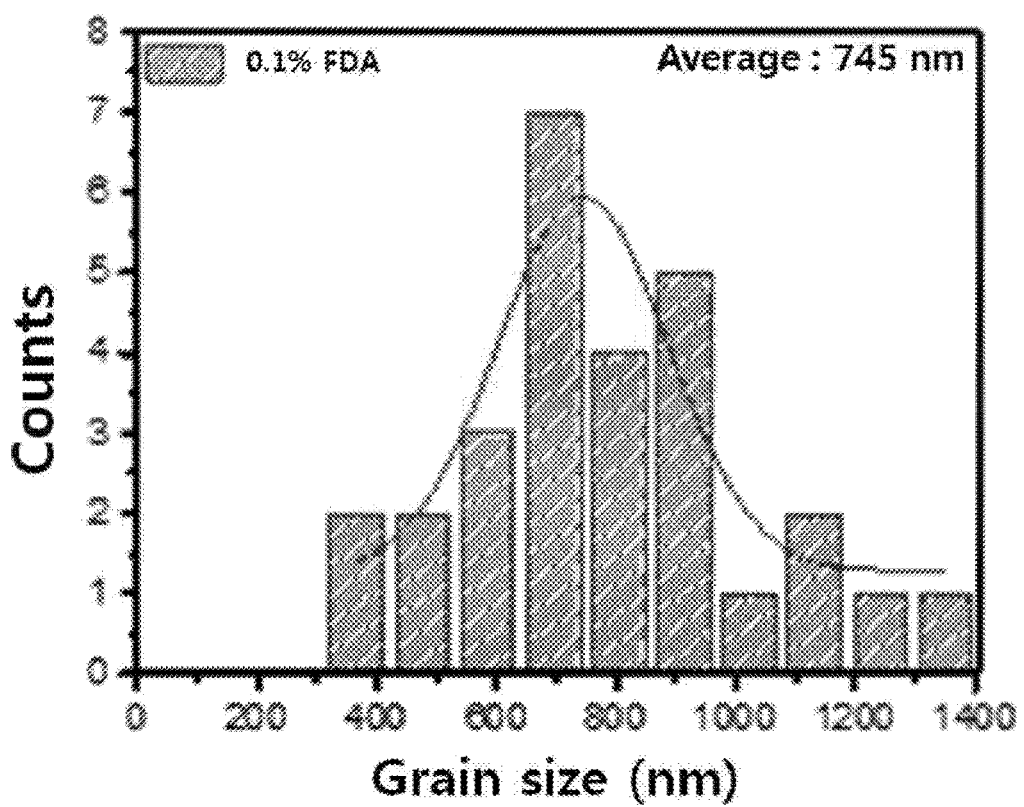
FIG. 21 is a result of calculating the grain size by analyzing the image of FIG. 16 with software (Nano Measurer 1.2) in the perovskite light absorption layer thin film according to Example 1 of the present application.

FIG. 21 is a result of calculating the grain size by analyzing the image of FIG. 16 with software (Nano Measurer 1.2) in the perovskite light absorption layer thin film according to Example 1 of the present application.

Referring to FIG. 21, according to Example 1 (0.1% FDA), the perovskite light absorption layer thin film has grains with a size of about 745 nm on average.

Figure 22:
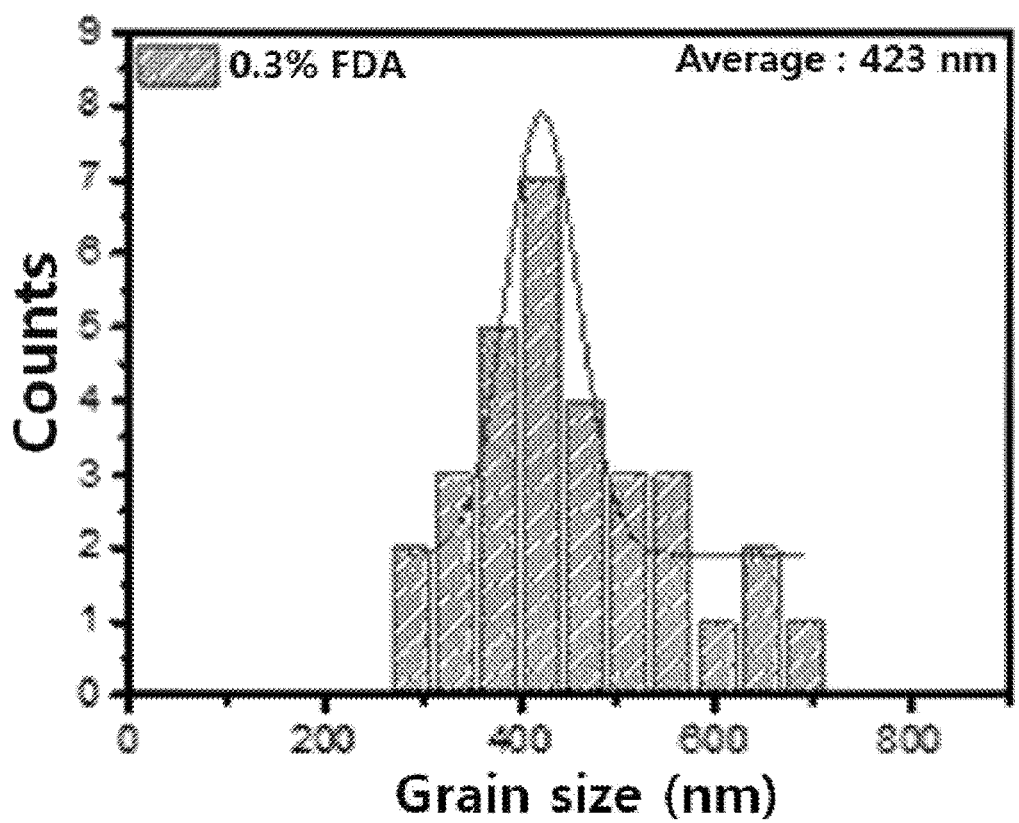
FIG. 22 is a result of calculating the grain size by analyzing the image of FIG. 17 with software (Nano Measurer 1.2) in the perovskite light absorption layer thin film according to Example 1 of the present application.

FIG. 22 is a result of calculating the grain size by analyzing the image of FIG. 17 with software (Nano Measurer 1.2) in the perovskite light absorption layer thin film according to Example 1 of the present application.

Referring to FIG. 22, it can be confirmed that the perovskite light absorption layer thin film, according to Example 1 (0.3% FDA), has grains with a size of about 423 nm on average.

Figure 23:
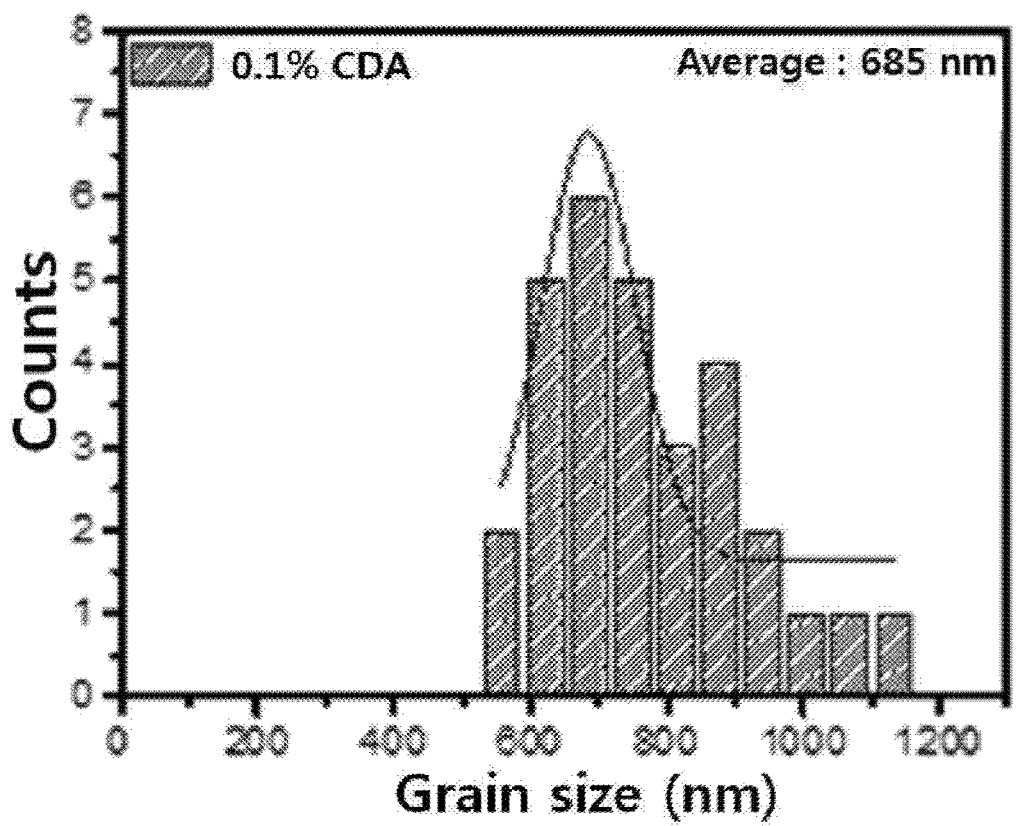
FIG. 23 is a result of calculating the grain size by analyzing the image of FIG. 18 with software (Nano Measurer 1.2) in the perovskite light absorption layer thin film according to Example 2 of the present application.

FIG. 23 is a result of calculating the grain size by analyzing the image of FIG. 18 with software (Nano Measurer 1.2) in the perovskite light absorption layer thin film according to Example 2 of the present application.

Referring to FIG. 23, it can be confirmed that the perovskite light absorption layer thin film according to Example 2 (0.1% CDA) has grains with a size of about 685 nm on average.

Figure 24:
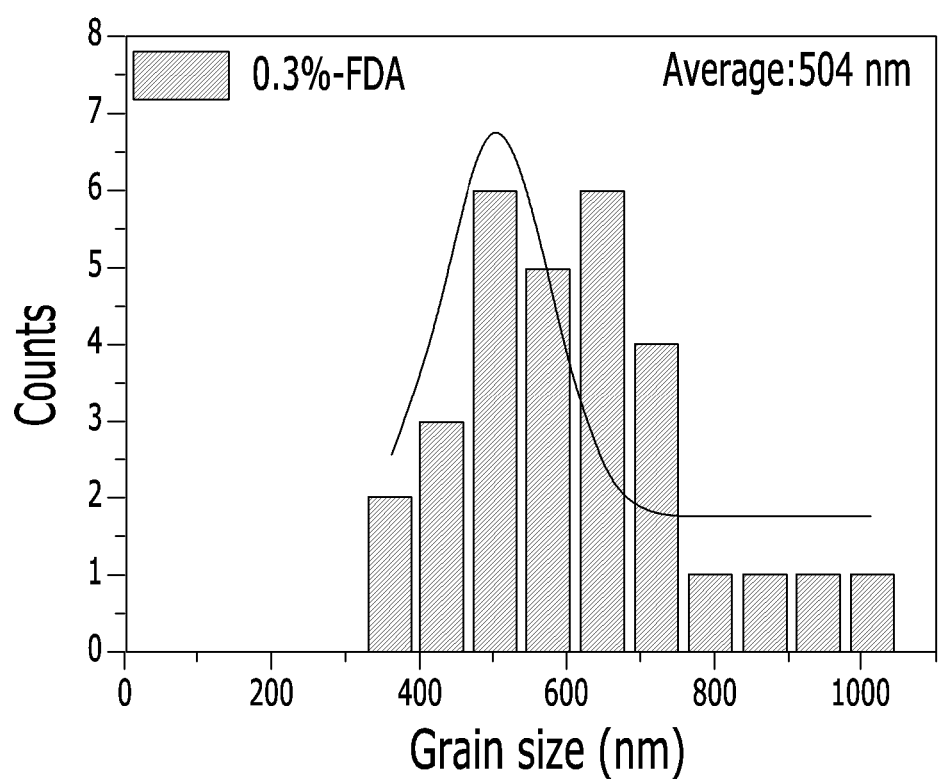
FIG. 24 is a result of calculating the grain size by analyzing the image of FIG. 19 with software (Nano Measurer 1.2) in the perovskite light absorption layer thin film according to Example 2 of the present application.

FIG. 24 is a result of calculating the grain size by analyzing the image of FIG. 19 with software (Nano Measurer 1.2) in the perovskite light absorption layer thin film according to Example 2 of the present application.

Referring to FIG. 24, it can be confirmed that the perovskite light absorption layer thin film, according to Example 2 (0.3% CDA), has grains with a size of about 504 nm on average.

That is, according to FIGS. 20 to 24, it can be seen that the sizes of the grains are remarkably increased in Examples 1 and 2, in which the additive is doped compared to Comparative Example.

Figure 25:
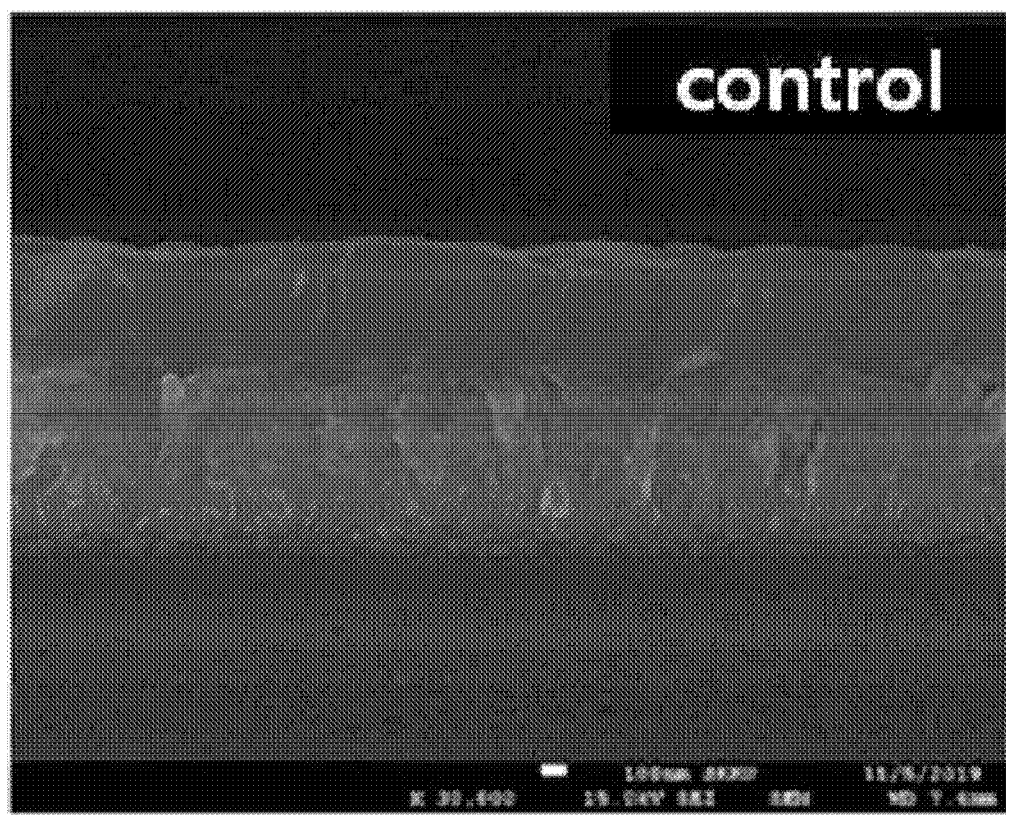
FIG. 25 is a field emission scanning electron microscope (FESEM) image of the side surface of the perovskite light absorption layer thin film according to Comparative Example of the present application.

FIG. 25 is a field emission scanning electron microscope (FESEM) image of the side surface of the perovskite light absorption layer thin film according to Comparative Example of the present application.

Figure 26:
FIG. 26 is a field emission scanning electron microscope (FESEM) image of the side surface of the perovskite light absorption layer thin film according to Example 1 of the present application.

FIG. 26 is a field emission scanning electron microscope (FESEM) image of the side surface of the perovskite light absorption layer thin film according to Example 1 of the present application.

Referring to FIG. 26, it can be observed that, when FDA is doped at a concentration of 0.1%, a single interface is formed in a direction perpendicular to the substrate direction.

Figure 27:
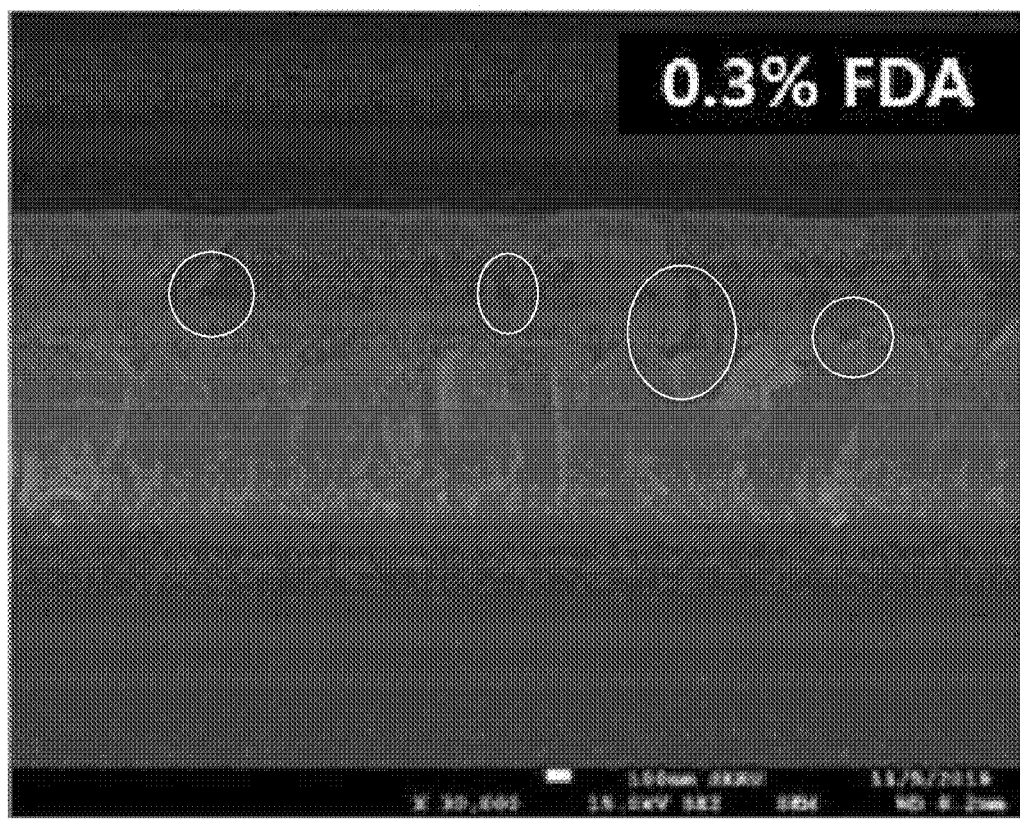
FIG. 27 is a field emission scanning electron microscope (FESEM) image of the side surface of the perovskite light absorption layer thin film according to Example 1 of the present application.

FIG. 27 is a field emission scanning electron microscope (FESEM) image of the side surface of the perovskite light absorption layer thin film according to Example 1 of the present application.

Referring to FIG. 27, it can be confirmed that, when FDA is doped at a concentration of 0.3%, a defective hole portion that can act as a trap site is formed.

Figure 28:
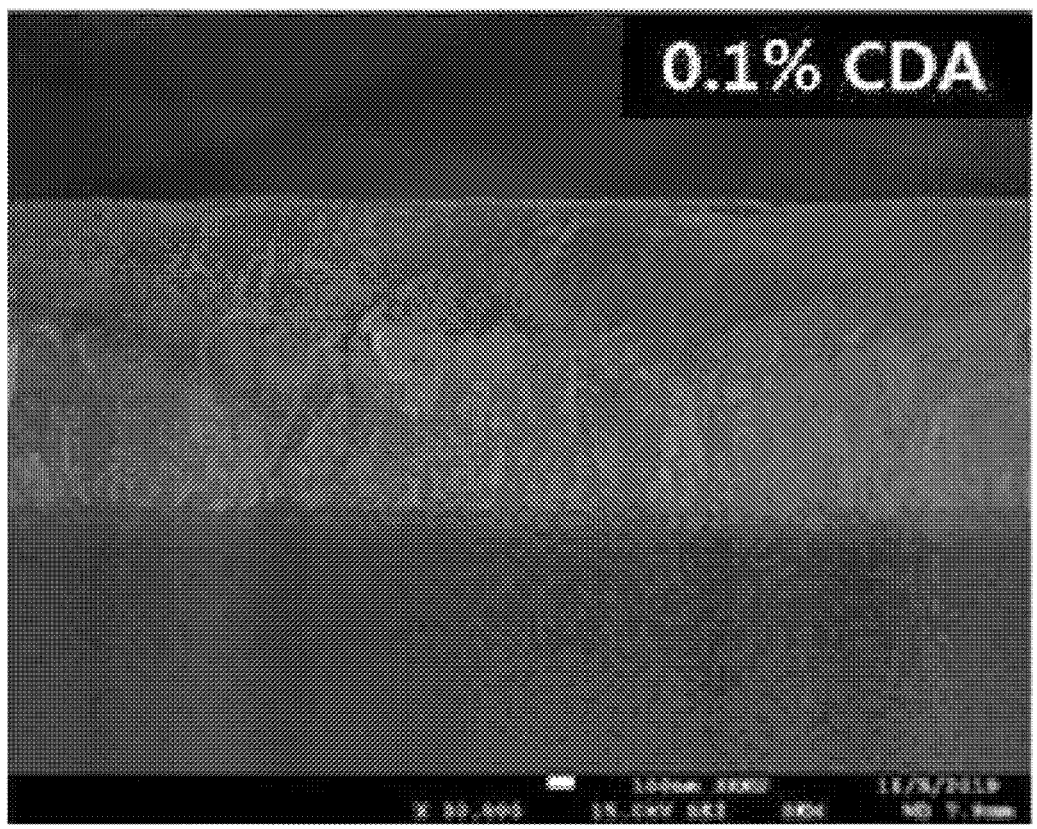
FIG. 28 is a field emission scanning electron microscope (FESEM) image of the side surface of the perovskite light absorption layer thin film according to Example 2 of the present application.

FIG. 28 is a field emission scanning electron microscope (FESEM) image of the side surface of the perovskite light absorption layer thin film according to Example 2 of the present application.

Referring to FIG. 28, it can be observed that, when CDA is doped at a concentration of 0.1%, a single interface is formed in a direction perpendicular to the substrate direction.

Figure 29:
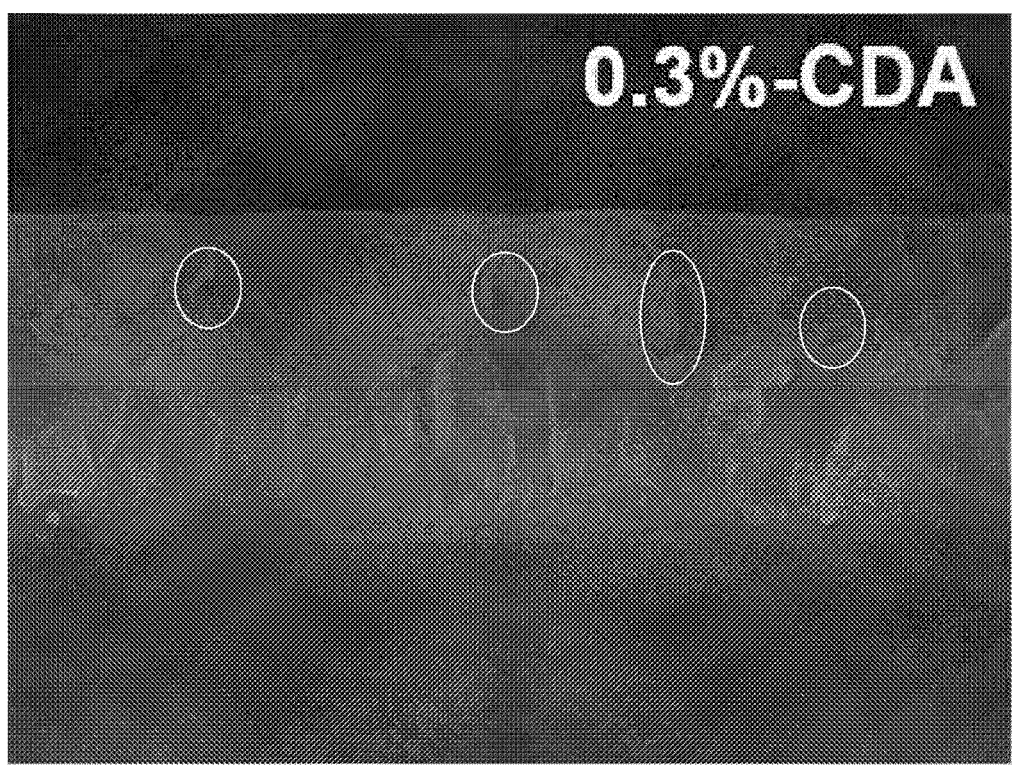
FIG. 29 is a field emission scanning electron microscope (FESEM) image of the side surface of the perovskite light absorption layer thin film according to Example 2 of the present application.

FIG. 29 is a field emission scanning electron microscope (FESEM) image of the side surface of the perovskite light absorption layer thin film according to Example 2 of the present application.

Referring to FIG. 29, it can be confirmed that, when CDA is doped at a concentration of 0.3%, a defective hole portion that can act as a trap site is formed.

Experimental Example 4

In order to confirm the stabilities of the perovskite solar cells according to extreme environmental conditions, the stabilities according to three environmental variables of moisture, heat, and light irradiation were measured.

1) Moisture Stability

In order to show that the moisture stability is improved when doping the additive, the perovskite light absorption layers were exposed for 0 to 400 hours under the condition of relative humidity (50±5%). Specifically, after storing the perovskite light absorption layers in a constant humidity cabinet for up to 400 hours, X-ray diffraction (XRD) analyses and absorbances with respect to the surface images of the perovskite light absorption layers doped with the additives of Comparative Example and Examples 1 and 2 were compared and confirmed.

Figure 30:
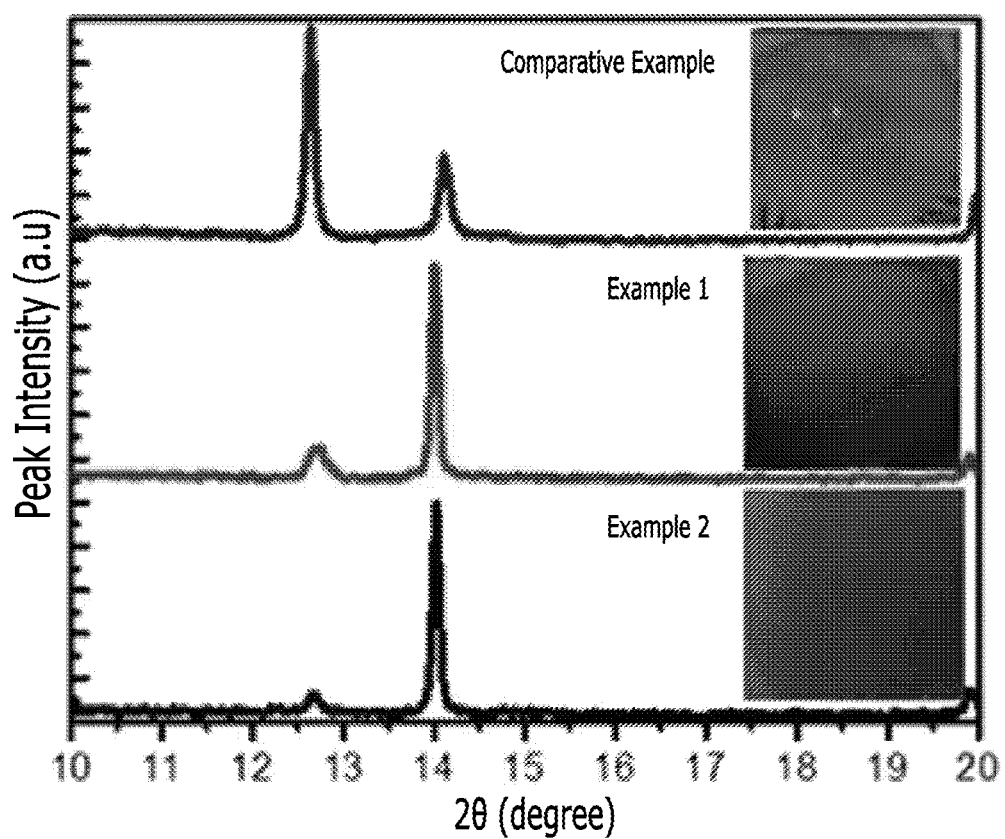
FIG. 30 is X-ray diffraction (XRD) analysis results of the surfaces of the perovskite light absorption layers under moisture stress of Example 1, Example 2, and Comparative Example of the present application.

FIG. 30 is X-ray diffraction (XRD) analysis results of the surfaces of the perovskite light absorption layers under moisture stress of Example 1, Example 2, and Comparative Example of the present application.

It is confirmed that, as time is elapsed after exposure under moisture stress, the peak of the 2θ value corresponding to 12.5° is greatly increased in the samples undoped with the additive compared to the samples doped with the additive. FIG. 30 is a view supporting the above-described description, and is XRD analysis results of Examples 1 and 2 and Comparative Example at a time point when a certain amount of time has elapsed after exposure under moisture stress. Referring to FIG. 30, the pick intensity corresponding to 12.5° in Comparative Example is remarkably high compared to Example 1 and Example 2, and it can be confirmed that the perovskite light absorption layer thin film has deteriorated through the photograph attached to the graph. This is a result that occurred while the structure of the perovskite light absorption layer thin film is being changed as $PbI_2$ contained in the perovskite light absorption layer thin film is decomposed in a large amount in Comparative Example compared to Examples. That is, it can be seen that moisture stability of the perovskite solar cell is remarkably improved by doping the additive in the method for manufacturing the perovskite solar cell according to the present application.

Figure 31:
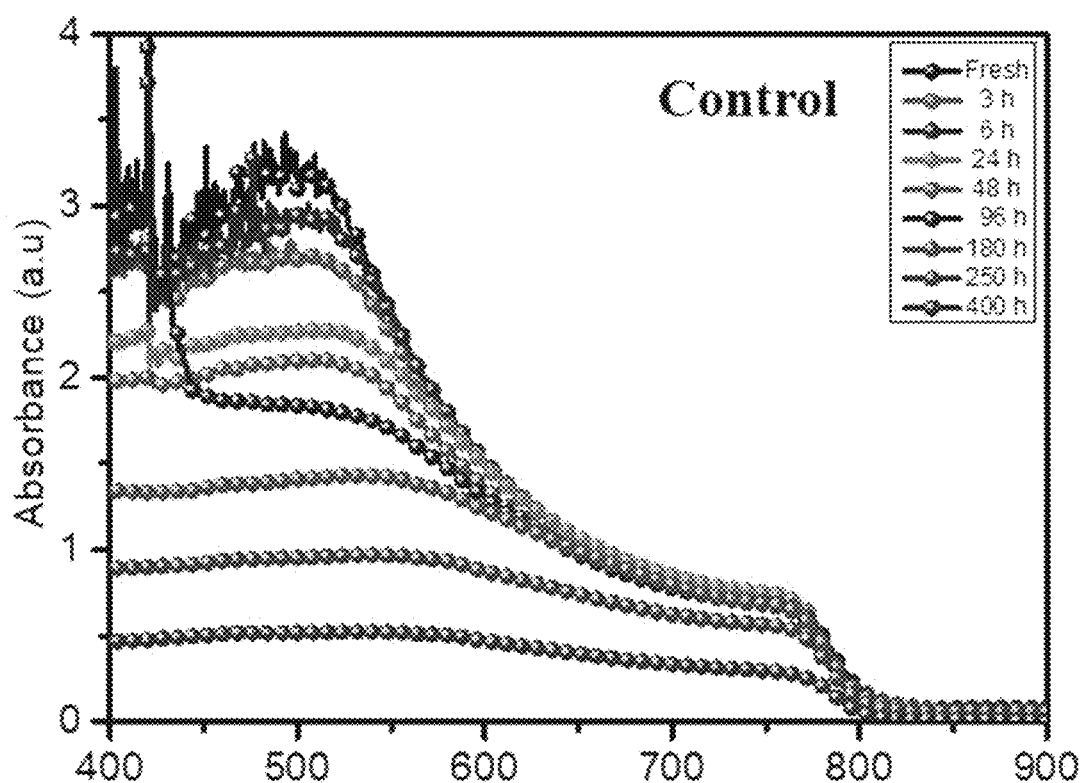
FIG. 31 is a graph showing absorbances by time with respect to wavelengths of the perovskite solar cell according to Comparative Example of the present application.

FIG. 31 is a graph showing absorbances by time with respect to wavelengths of the perovskite solar cell according to Comparative Example of the present application.

Figure 32:
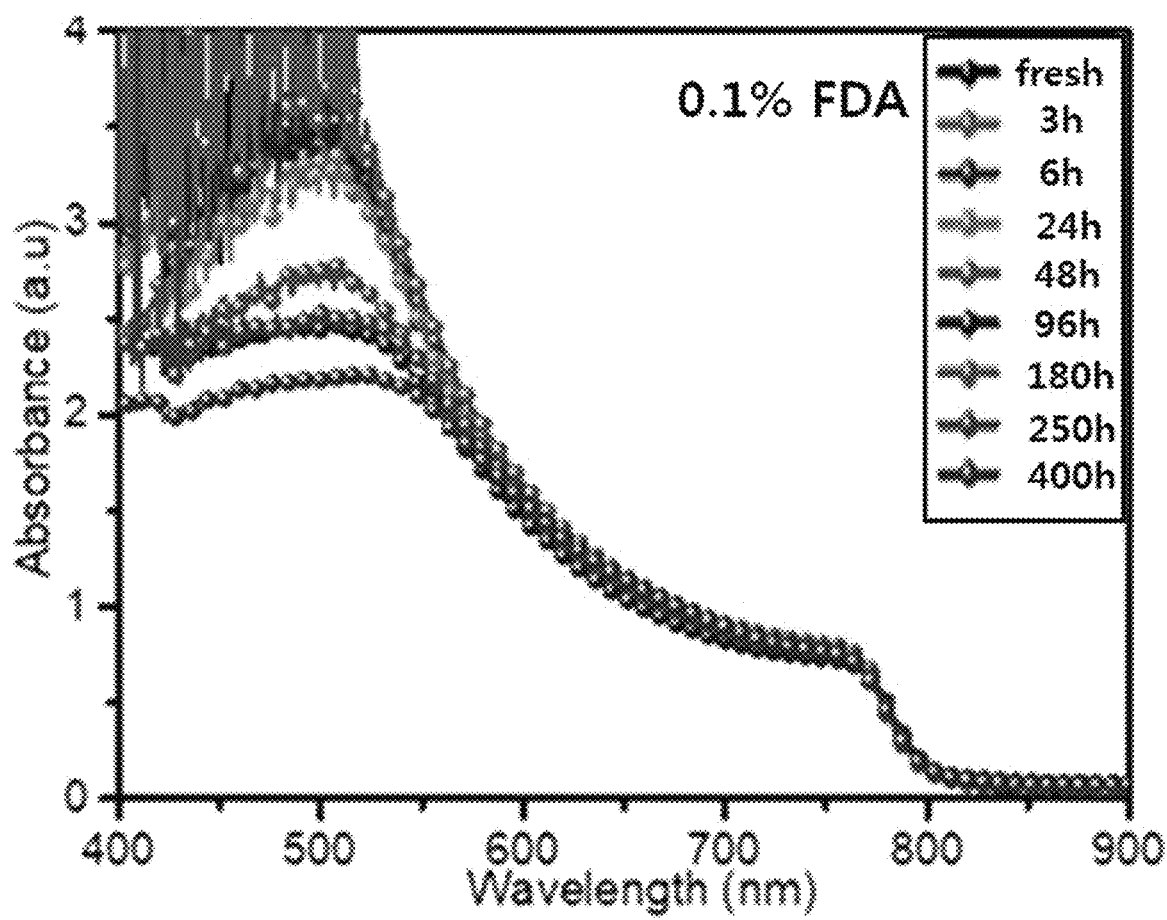
FIG. 32 is a graph showing absorbances by time with respect to wavelengths of the perovskite solar cell according to Example 1 (0.1% FDA doping) of the present application.

FIG. 32 is a graph showing absorbances by time with respect to wavelengths of the perovskite solar cell according to Example 1 (0.1% FDA doping) of the present application.

Figure 33:
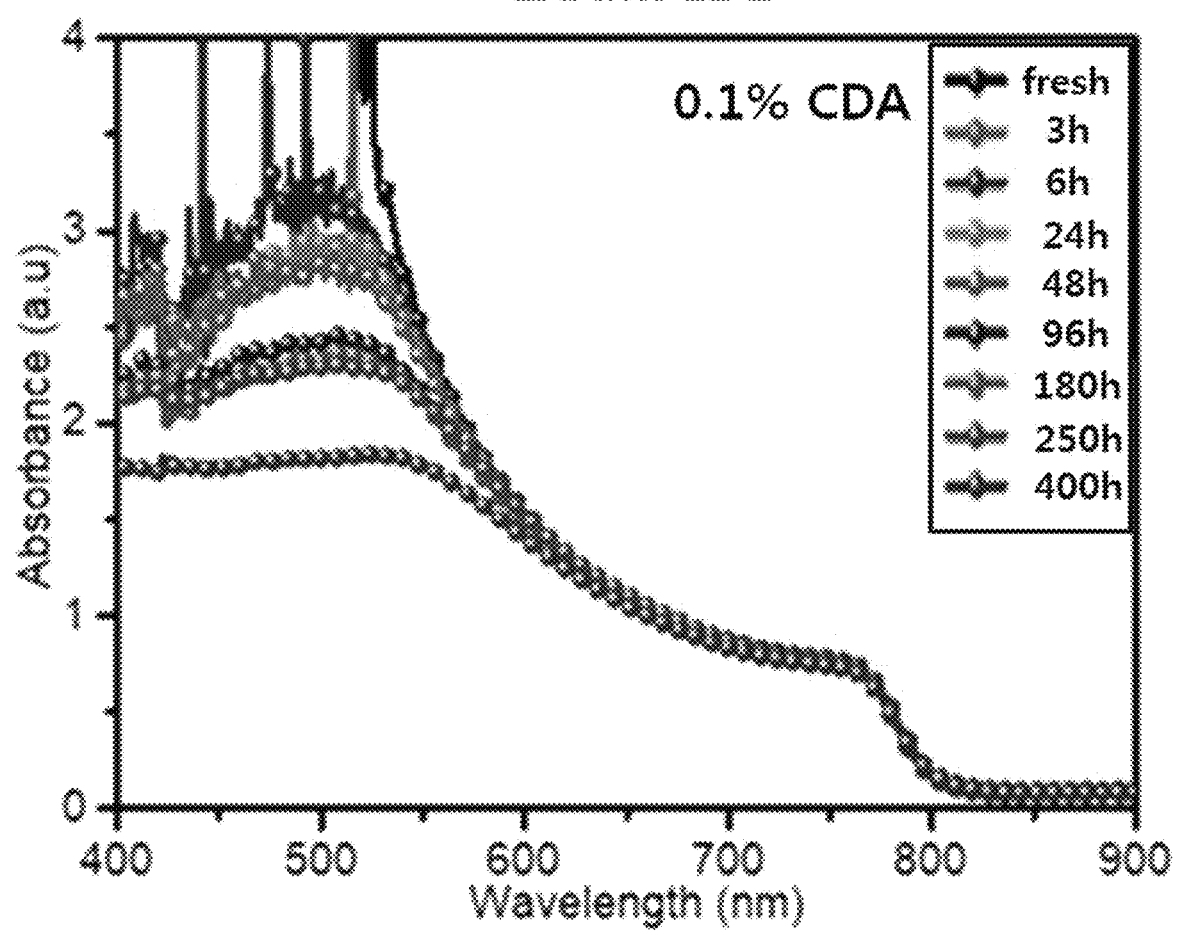
FIG. 33 is a graph showing absorbances by time with respect to wavelengths of the perovskite solar cell according to Example 2 (0.1% CDA doping) of the present application.

FIG. 33 is a graph showing absorbances by time with respect to wavelengths of the perovskite solar cell according to Example 2 (0.1% CDA doping) of the present application.

Referring to FIGS. 31 to 33, it can be confirmed that decreases in absorbances according to time elapse are noticeably small in the whole wavelength range in Examples 1 and 2 compared to Comparative Example. Through this, it can be seen that moisture stabilities are remarkably improved by doping the additive in Examples 1 and 2 compared to Comparative Example.

2) Thermal Stability

With respect to Examples 1 and 2 and Comparative Example, phase changes and absorbance changes were measured while performing a heating process for 0 to 400 hours under a nitrogen atmosphere at 85° C.

Figure 34:
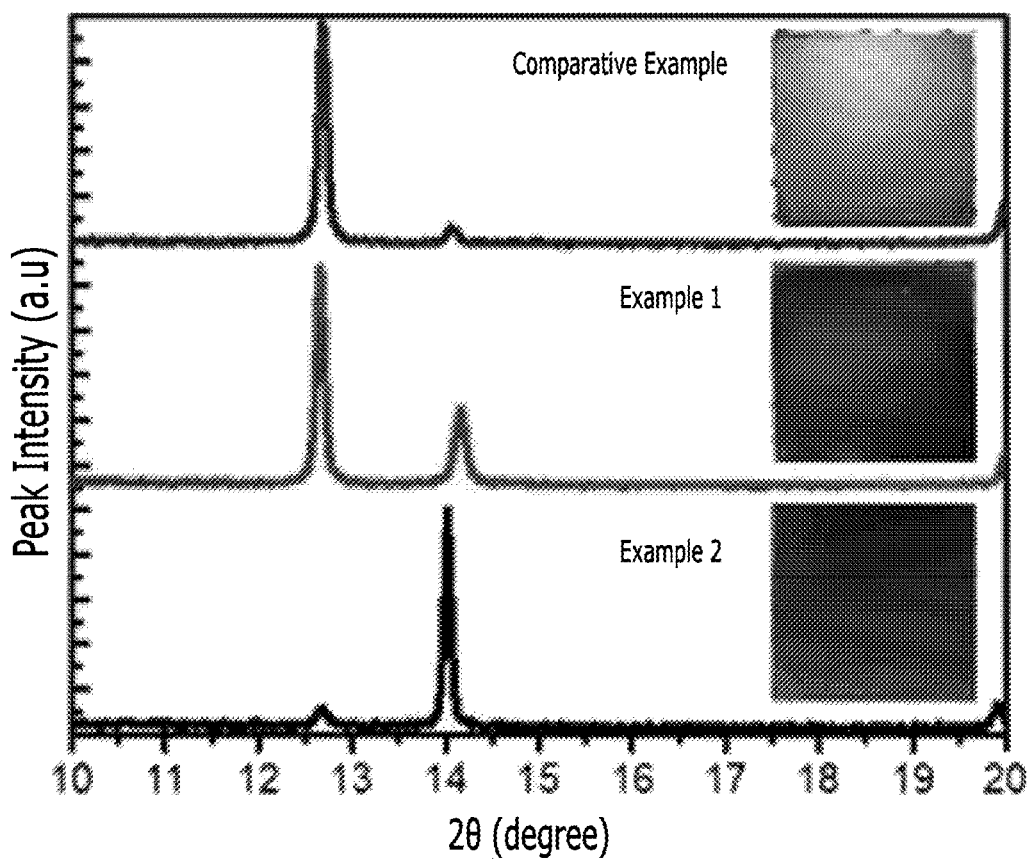
FIG. 34 is X-ray diffraction (XRD) analysis results of the surfaces of the perovskite light absorption layers under thermal stress of Example 1, Example 2, and Comparative Example of the present application.

FIG. 34 is X-ray diffraction (XRD) analysis results of the surfaces of the perovskite light absorption layers under thermal stress of Example 1, Example 2, and Comparative Example of the present application.

It is confirmed that, as time is elapsed after exposure under thermal stress, the peak of the 2θ value corresponding to 12.5° is greatly increased in the samples undoped with the additive compared to the samples doped with the additive. FIG. 34 is a view supporting the above-described description, and is XRD analysis results of Examples 1 and 2 and Comparative Example at a time point when a certain amount of time has elapsed after exposure under thermal stress. Referring to FIG. 34, the pick intensity corresponding to 12.5° in Comparative Example is remarkably high compared to Example 1 and Example 2. It can be confirmed that the perovskite light absorption layer thin film has deteriorated through the photograph attached to the graph. This is a result that occurred while the structure of the perovskite light absorption layer thin film is being changed as $PbI_2$ contained in the perovskite light absorption layer thin film is decomposed in a large amount in Comparative Example compared to Examples. That is, it can be seen that the thermal stability of the perovskite solar cell is remarkably improved by doping the additive in the method for manufacturing the perovskite solar cell according to the present application.

Figure 35:
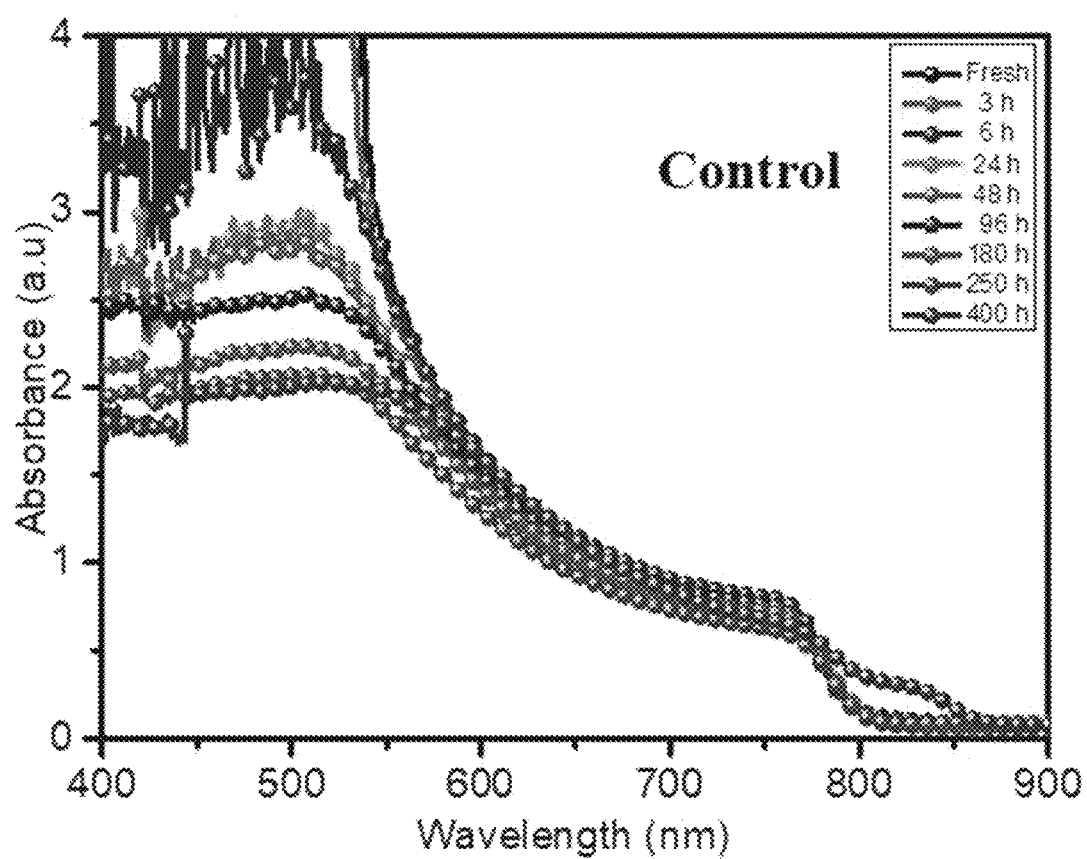
FIG. 35 is a graph showing absorbances by time with respect to wavelengths of the perovskite solar cell according to Comparative Example of the present application.

FIG. 35 is a graph showing absorbances by time with respect to wavelengths of the perovskite solar cell according to Comparative Example of the present application.

Figure 36:
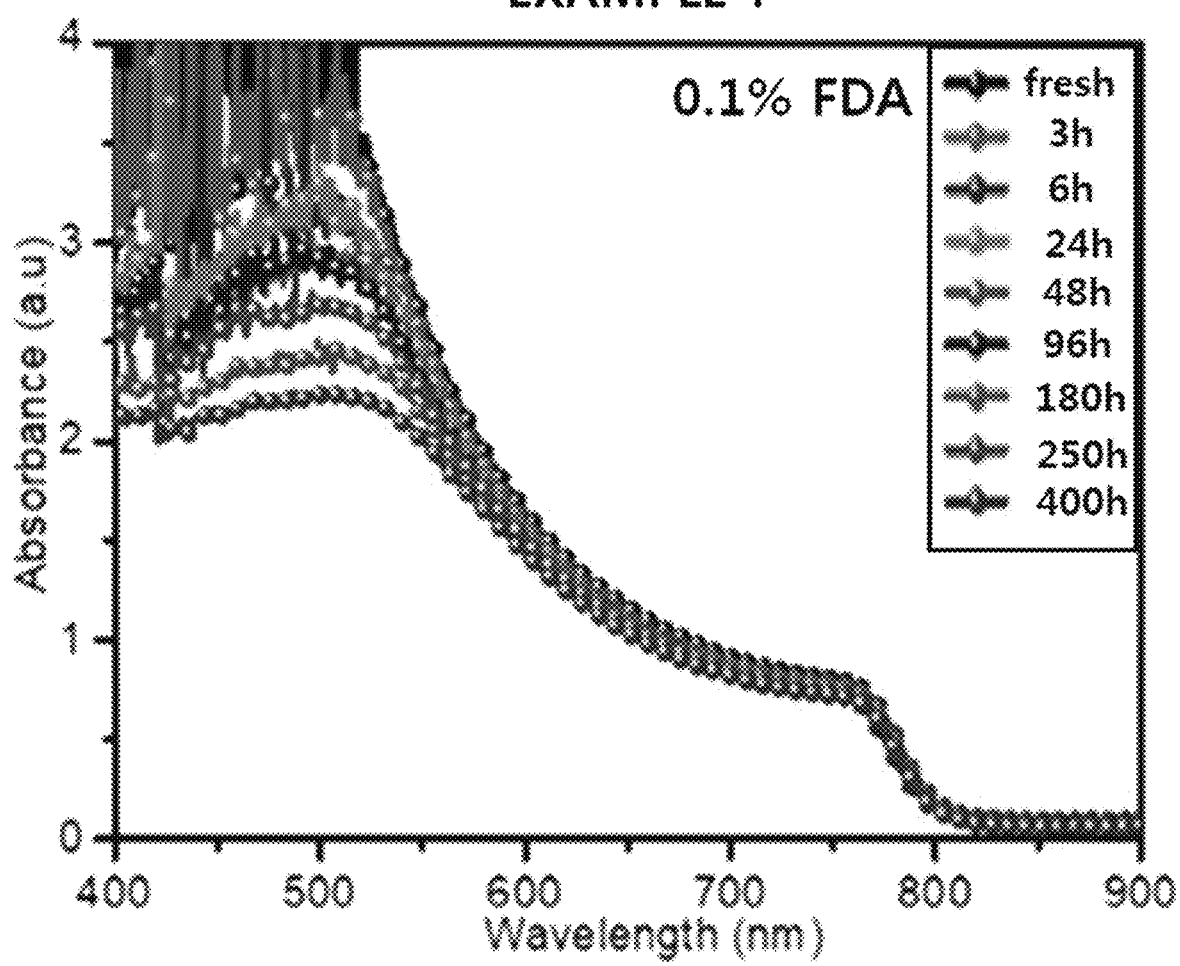
FIG. 36 is a graph showing absorbances by time with respect to wavelengths of the perovskite solar cell according to Example 1 (0.1% FDA doping) of the present application.

FIG. 36 is a graph showing absorbances by time with respect to wavelengths of the perovskite solar cell according to Example 1 (0.1% FDA doping) of the present application.

Figure 37:
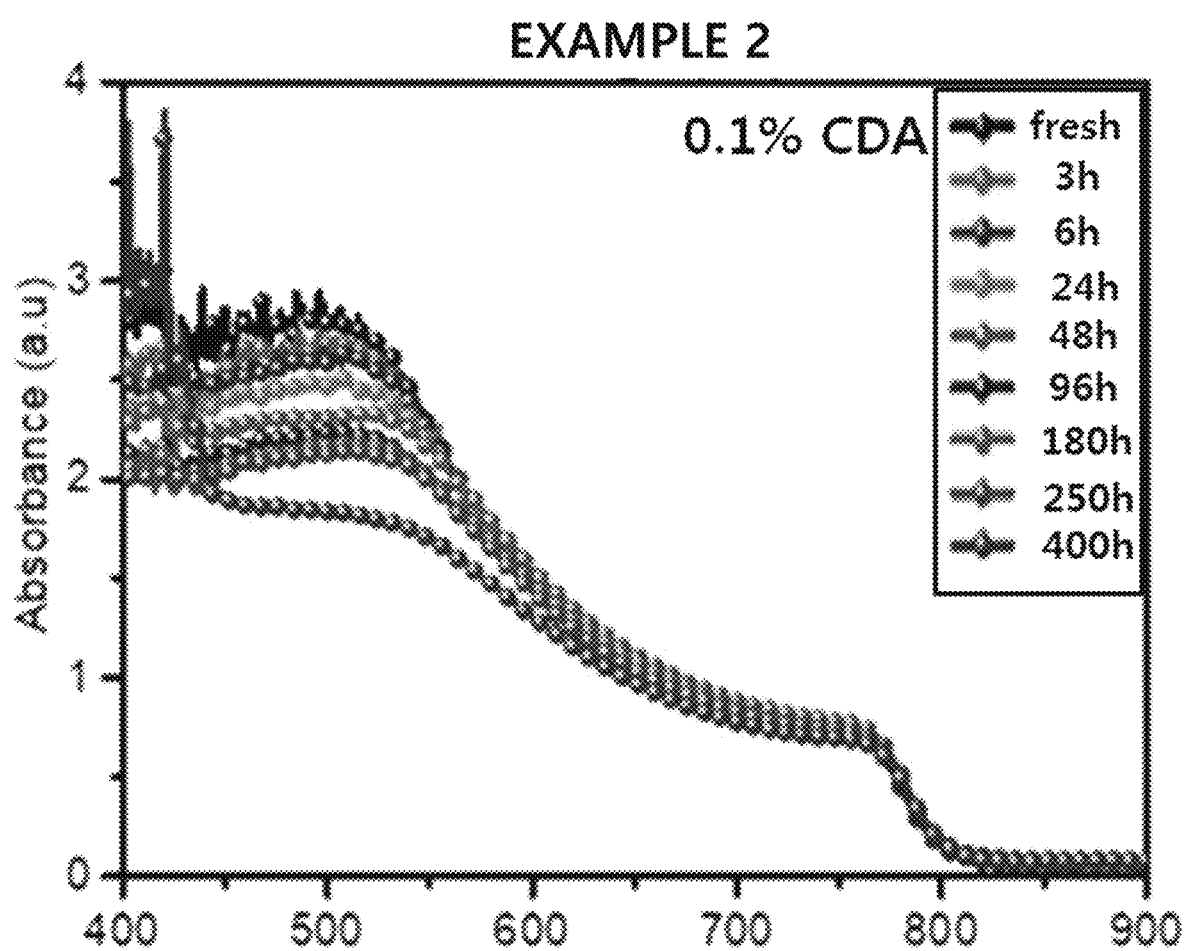
FIG. 37 is a graph showing absorbances by time with respect to wavelengths of the perovskite solar cell according to Example 2 (0.1% CDA doping) of the present application.

FIG. 37 is a graph showing absorbances by time with respect to wavelengths of the perovskite solar cell according to Example 2 (0.1% CDA doping) of the present application.

Referring to FIGS. 35 to 37, it can be confirmed that decreases in absorbances according to time elapse are noticeably small in the whole wavelength range in Examples 1 and 2 compared to Comparative Example. Through this, it can be seen that thermal stabilities are remarkably improved by doping the additive in Examples 1 and 2 compared to Comparative Example.

3) Light Stability

Light stabilities according to the exposure time were confirmed by irradiating light corresponding to 1 sun {Air Mass (AM} 1.5) to the surface of the perovskite with respect to Examples 1 and 2 and Comparative Example. For reference, light corresponding to AM 1.5 represents the same light as the sunlight when the sun is floating at 48.2 degrees based on a vertical line. The perovskite solar cells of Example 1, Example 2, and Comparative Example were exposed under the light stress for 0 to 400 hours.

Figure 38:
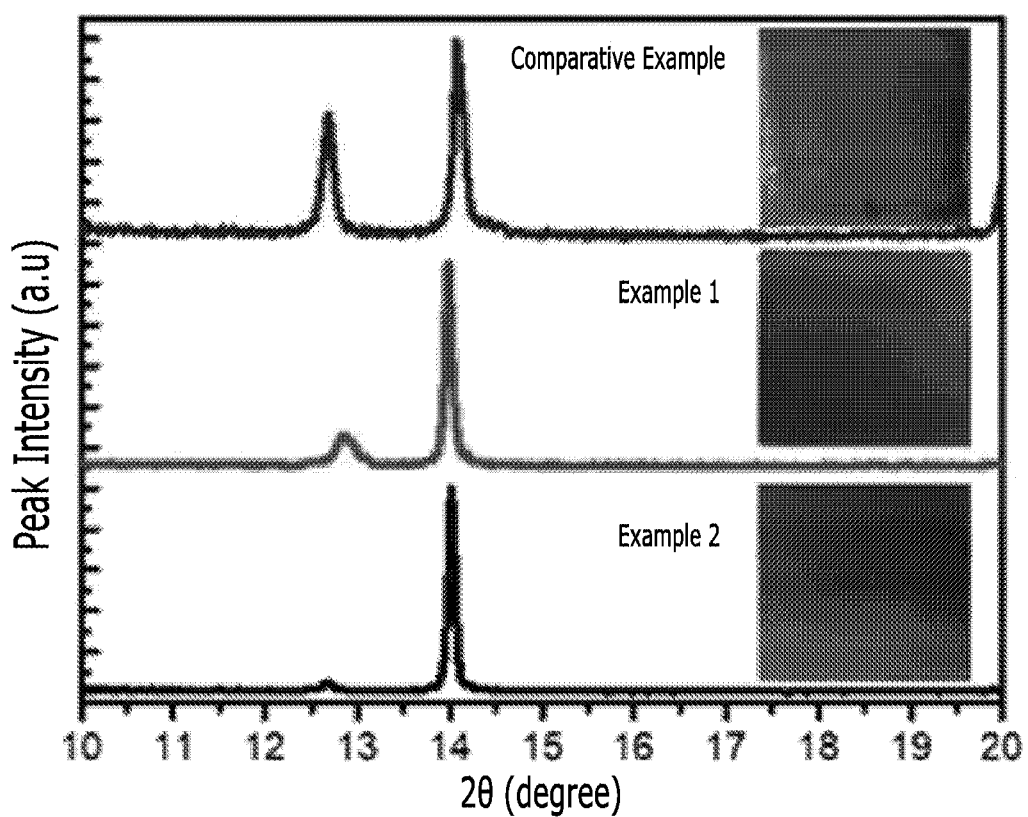
FIG. 38 is X-ray diffraction (XRD) analysis results of the surfaces of the perovskite light absorption layers under light stress of Example 1, Example 2, and Comparative Example of the present application.

FIG. 38 is X-ray diffraction (XRD) analysis results of the surfaces of the perovskite light absorption layers under light stress of Example 1, Example 2, and Comparative Example of the present application.

It is confirmed that, as time is elapsed after exposure under light stress, the peak of the 2θ value corresponding to 12.5° is greatly increased in the samples undoped with the additive compared to the samples doped with the additive. FIG. 38 is a view supporting the above-described description, and is XRD analysis results of Examples 1 and 2 and Comparative Example at a time point when a certain amount of time has elapsed after exposure under light stress. Referring to FIG. 38, the pick intensity corresponding to 12.5° in Comparative Example is remarkably high compared to Example 1 and Example 2, and it can be confirmed that the perovskite light absorption layer thin film has deteriorated through the photograph attached to the graph. This is a result occurred while the structure of the perovskite light absorption layer thin film is being changed as $PbI_2$ contained in the perovskite light absorption layer thin film is decomposed in a large amount in Comparative Example compared to Examples. That is, it can be seen that the light stability of the perovskite solar cell is remarkably improved by doping the additive in the method for manufacturing the perovskite solar cell according to the present application.

Figure 39:
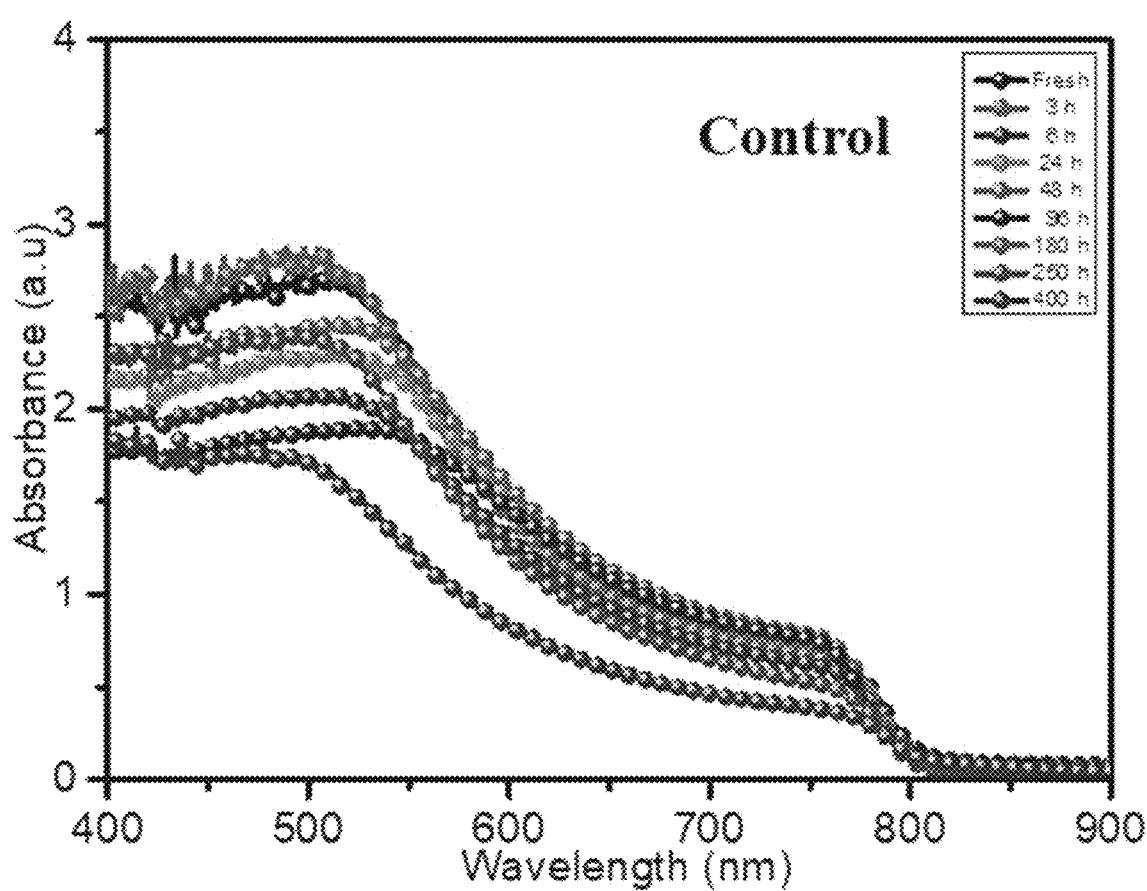
FIG. 39 is a graph showing absorbances by time with respect to wavelengths of the perovskite solar cell according to a Comparative Example of the present application.

FIG. 39 is a graph showing absorbances by time with respect to wavelengths of the perovskite solar cell according to Comparative Example of the present application.

Figure 40:
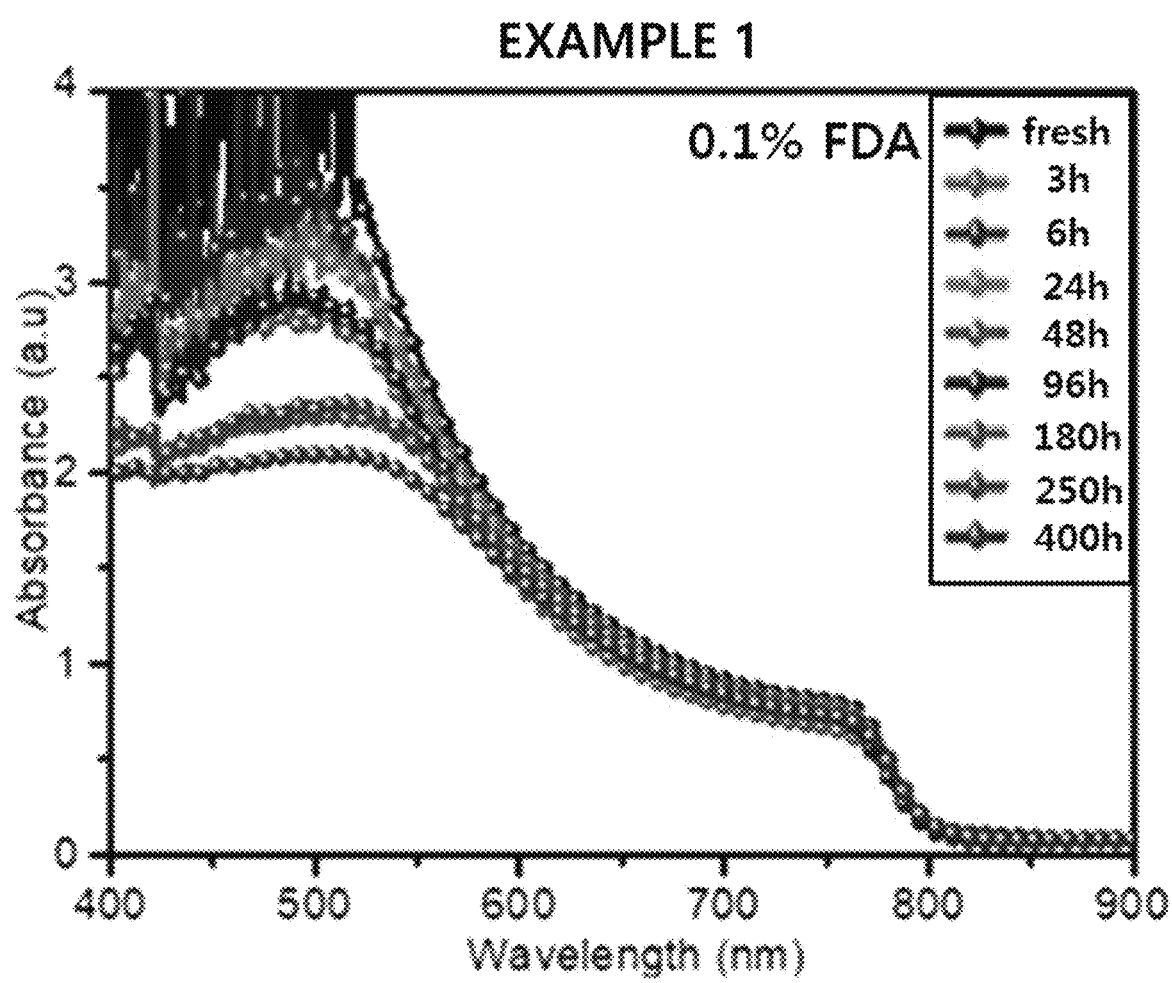
FIG. 40 is a graph showing absorbances by time with respect to wavelengths of the perovskite solar cell according to Example 1 (0.1% FDA doping) of the present application.

FIG. 40 is a graph showing absorbances by time with respect to wavelengths of the perovskite solar cell according to Example 1 (0.1% FDA doping) of the present application.

Figure 41:
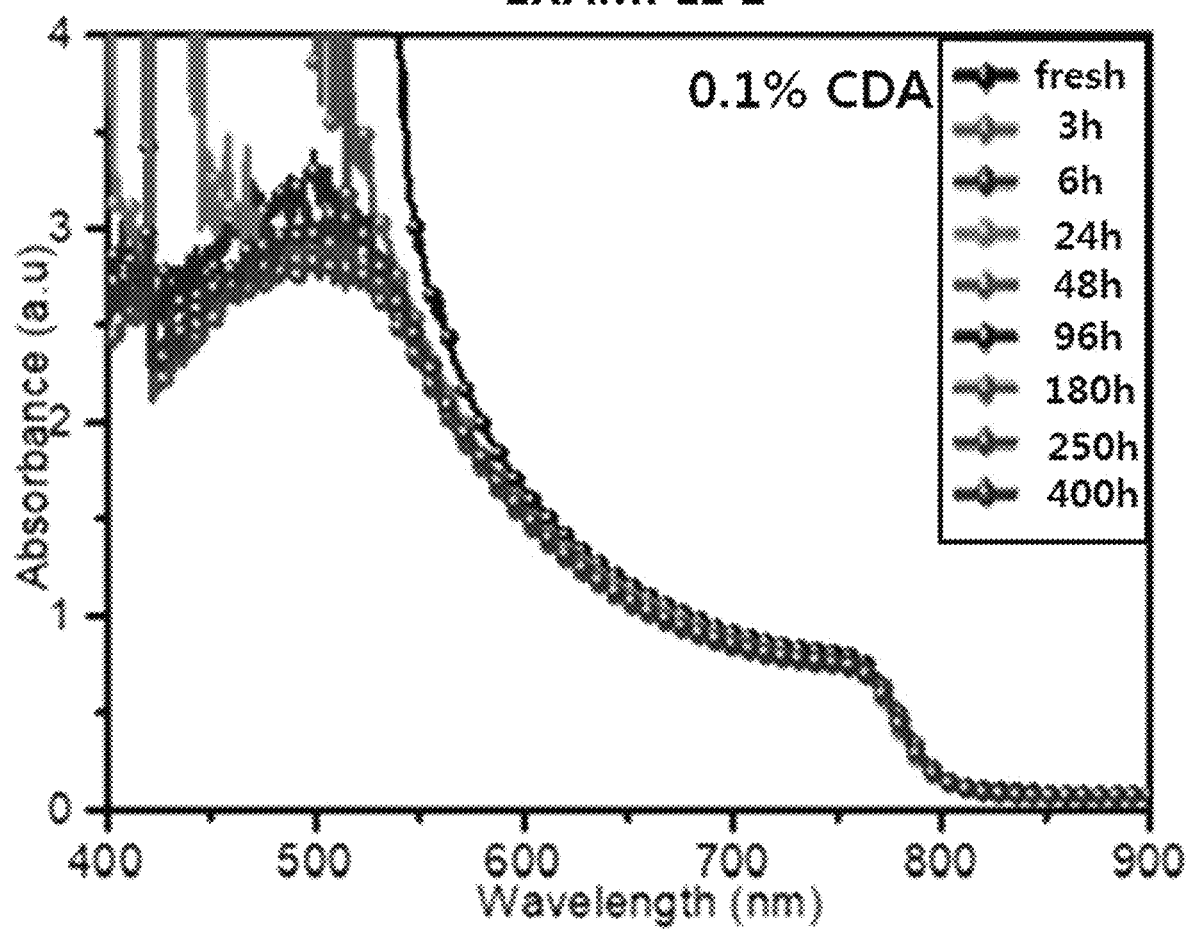
FIG. 41 is a graph showing absorbances by time with respect to wavelengths of the perovskite solar cell according to Example 2 (0.1% CDA doping) of the present application.

FIG. 41 is a graph showing absorbances by time with respect to wavelengths of the perovskite solar cell according to Example 2 (0.1% CDA doping) of the present application.

Referring to FIGS. 39 to 41, it can be confirmed that decreases in absorbances according to time elapse are noticeably small in the whole wavelength range in Examples 1 and 2 compared to Comparative Example. Through this, it can be seen that light stabilities are remarkably improved by doping the additive in Examples 1 and 2 compared to Comparative Example.

Experimental Example 5

Stabilities over time were tested with respect to the perovskite solar cells according to Examples 1 (0.1% FDA), Example 2 (0.1% CDA), and Comparative Example while operating the solar cells for a long time under moisture stress conditions, thermal stress conditions, and encapsulation conditions.

1) Moisture Stress Conditions

Specifically, the perovskite solar cells were stored for 1,000 hours under 20° C. room temperature, 50±5% relative humidity, and constant temperature and humidity conditions.

Figure 42:
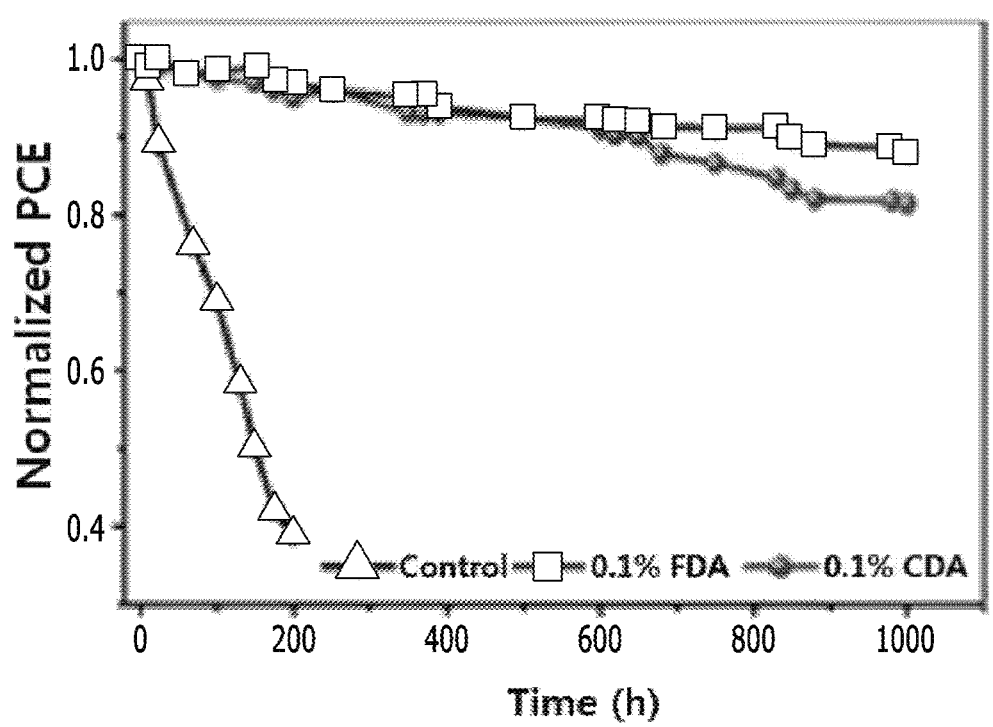
FIG. 42 is a graph of normalized power conversion efficiencies (PCE) of the perovskite solar cells according to Example 1, Example 2, and Comparative Example of the present application.

FIG. 42 is a graph of normalized power conversion efficiencies (PCE) of the perovskite solar cells according to Example 1, Example 2, and Comparative Example of the present application.

Referring to FIG. 42, it can be confirmed that the normalized power conversion efficiencies are slightly decreased to 12% and 19%, respectively, compared to the initial value during the entire operating time so that high levels of power conversion efficiencies are maintained in Examples 1 and 2. In contrast, the normalized power conversion efficiency is reduced by 62% compared to the initial value for about 200 hours immediately after starting the operation in Comparative Example.

2) Room Temperature Conditions

Specifically, the perovskite solar cells were heat-treated for 1,000 hours at a temperature of 80° C. under nitrogen atmosphere, constant temperature and humidity (relative humidity 10±5%) conditions, and dark conditions.

Figure 43:
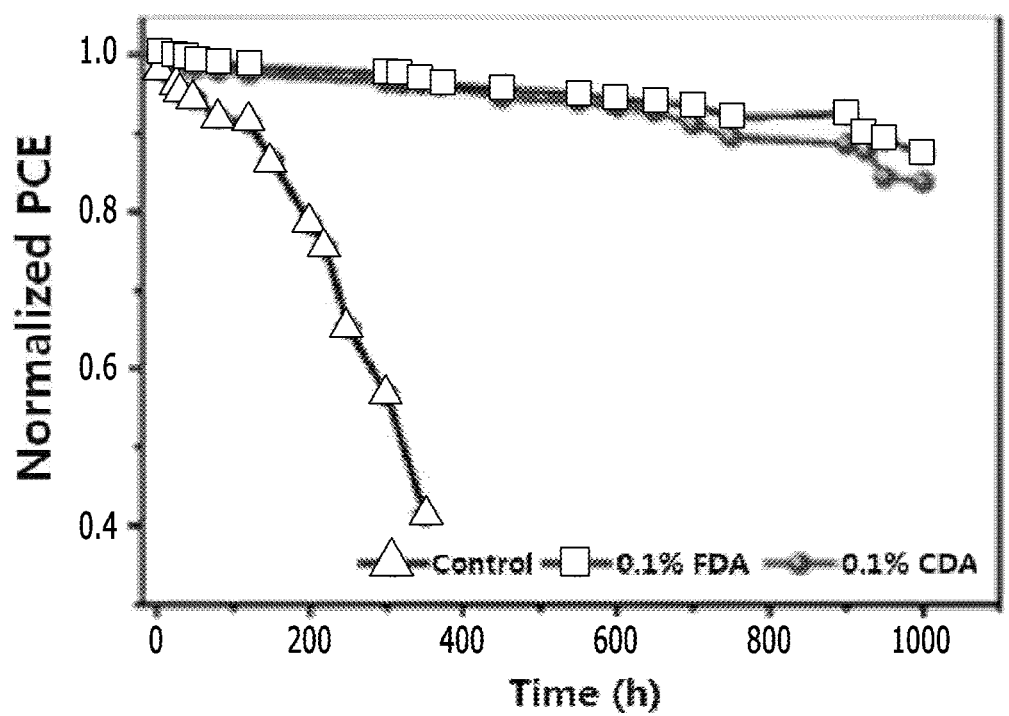
FIG. 43 is a graph of normalized power conversion efficiencies (PCE) of the perovskite solar cells according to Example 1, Example 2, and Comparative Example of the present application.

FIG. 43 is a graph of normalized power conversion efficiencies (PCE) of the perovskite solar cells according to Example 1, Example 2, and Comparative Example of the present application.

Referring to FIG. 43, it can be confirmed that the normalized power conversion efficiencies are slightly decreased to 13% and 17%, respectively, compared to the initial value during the entire operating time so that high levels of power conversion efficiencies are maintained in Examples 1 and 2. In contrast, the normalized power conversion efficiency is reduced by 41% compared to the initial value for about 250 hours immediately after starting the operation in Comparative Example.

3) Encapsulation Conditions

Specifically, the encapsulated solar cells were each stored for 1,000 hours under nitrogen atmosphere, constant temperature and humidity (relative humidity 10±5%) conditions, and 20° C. room temperature conditions.

Figure 44:
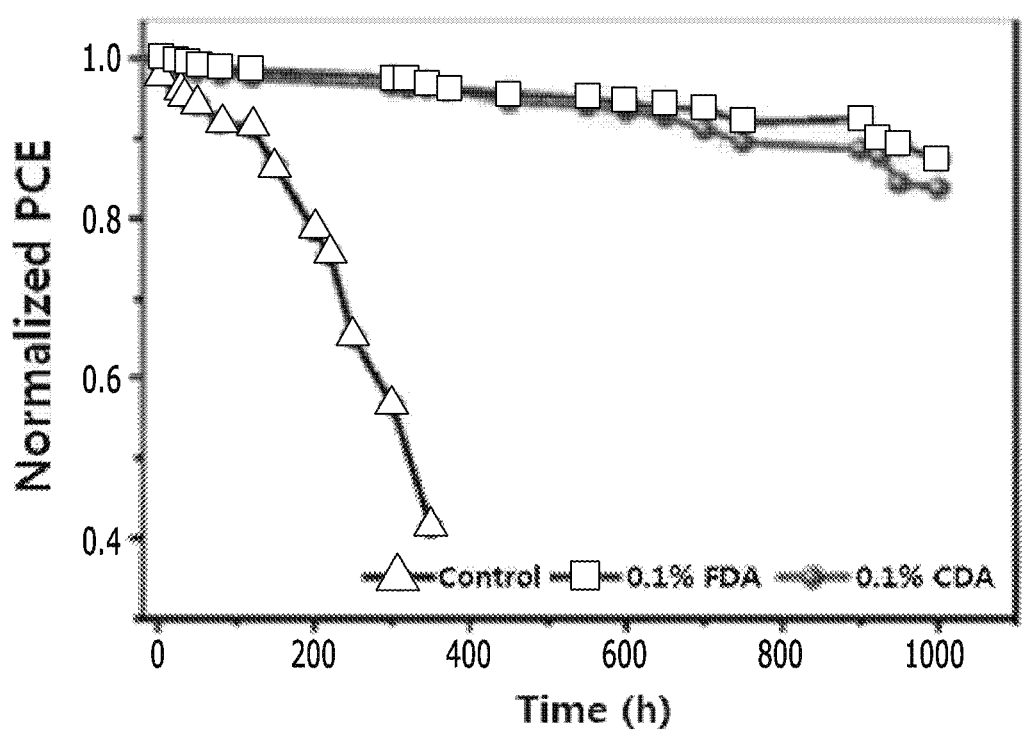
FIG. 44 is a graph of normalized power conversion efficiencies (PCE) of the perovskite solar cells according to Example 1, Example 2, and Comparative Example of the present application.

FIG. 44 is a graph of normalized power conversion efficiencies (PCE) of the perovskite solar cells according to Example 1, Example 2, and Comparative Example of the present application.

Referring to FIG. 44, it can be confirmed that the normalized power conversion efficiencies maintain a level of the initial value for 1,000 hours after starting the operation in Examples 1 and 2, whereas the normalized power conversion efficiency is reduced by 62% compared to the initial value for about 750 hours immediately after starting the operation in Comparative Example. That is, it can be seen that the perovskite solar cell, according to the present application, may maintain the power conversion efficiency at a level close to 100% of the initial stage for a long time when encapsulation is additionally performed.

Experimental Example 6

Figure 45:
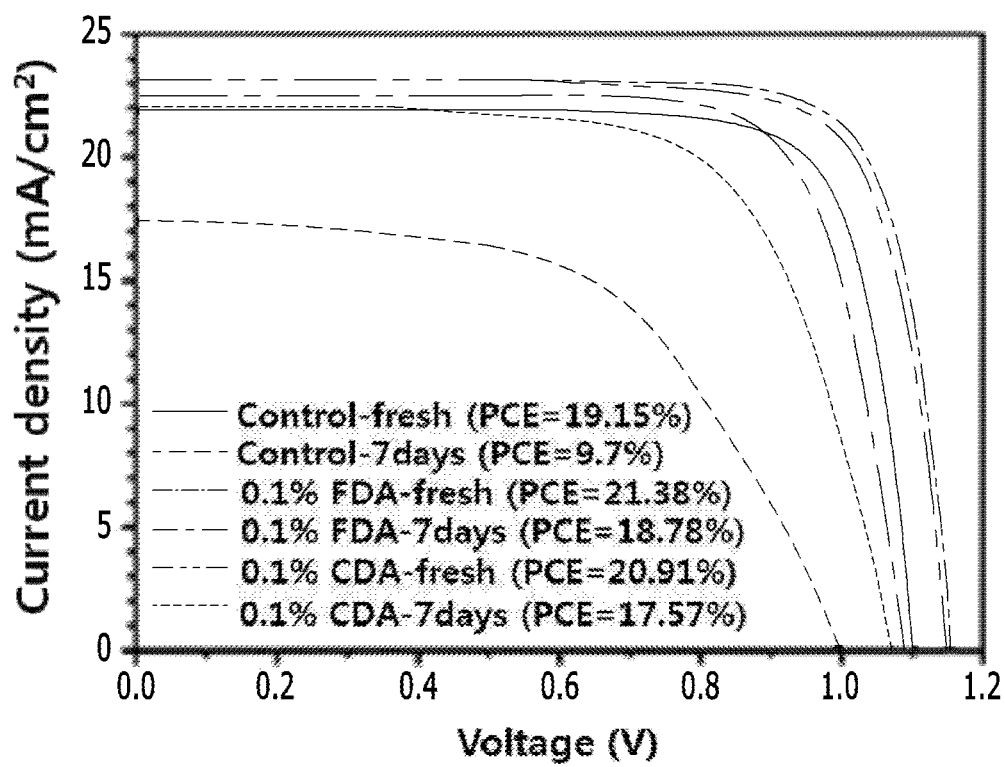
FIG. 45 is a graph showing stabilities with or without additive doping of the perovskite precursor solutions according to Examples and Comparative Example of the present application.

FIG. 45 is a graph showing stabilities with or without additive doping of the perovskite precursor solutions according to Examples and Comparative Example of the present application.

After forming perovskite precursor solutions by the methods according to Example 1 (0.1% FDA), Example 2 (0.1% CDA), and Comparative Example (no additive doping), the formed perovskite precursor solutions were stored for 7 days.

Subsequently, after manufacturing perovskite solar cells by the methods according to Examples and Comparative Example using the perovskite precursor solutions, element driving stabilities were measured.

Referring to FIG. 45, it can be confirmed that the efficiency drops significantly from 19.15% to 9.7% when aging the perovskite precursor solution for 7 days in Comparative Example, whereas the efficiencies are decreased relatively slightly from 21.38% to 18.78% in the case of Example 1, and from 20.91% to 17.57% in the case of Example 2 so that the perovskite precursor solutions have high stabilities in Examples 1 and 2 compared to Comparative Example. This suggests that the perovskite precursor solution doped with the additive according to the present application has excellent stability.

The above-described problem solving solutions are merely examples, and should not be construed as an intention of limiting the present application. In addition to the above-described embodiments, additional embodiments may exist in the drawings and detailed description of the present disclosure.

The present application is intended to solve the problems of the conventional art described above and provides a perovskite solar cell and a method for manufacturing the same.

Since a perovskite solar cell according to the present application includes a perovskite light absorption layer doped with the additive having hydrophobicity, it may maintain high power conversion efficiency even in a high humidity environment.

Since the additive has an excellent reaction with a material essentially included in a perovskite precursor material, it strongly interacts with materials at the M site and the X site of the perovskite material (for example, $RMX_3$ or $R_4MX_6$) to form a Lewis adduct, and the additive may be included in the perovskite light absorption layer.

Further, the additive reacts with the perovskite precursor and stabilizes the perovskite precursor solution so that sufficient aging time may be ensured, and the additive may promote the formation of a perovskite crystal on the perovskite precursor solution.

Further, the perovskite solar cell, according to the present application, is doped with the additive so that the additive may react with the perovskite precursor to form a cross-linked structure. Accordingly, it is possible to suppress the formation of defects of a light absorber thin film by adding an organic thin film, and to significantly improve stability by reducing the trap density by connecting the crystals to each other.

Further, the perovskite solar cell, according to the present application, is doped with the additive so that the crystal phase of the perovskite light absorption layer exists as a stable phase (α-phase), and the size of grains of the crystal of the perovskite light absorption layer is increased to improve the crystallinity. The additive may serve as passivation in the perovskite light absorption layer.

Further, the perovskite solar cell according to the present application may obtain an excellent durable perovskite thin film with a stable α-phase through the hydrogen bonding of F—HN possessed by a thin film-doped material of the perovskite light absorption layer and the lead chelation of F—Pb or O—Pb of the perovskite.

However, the effects obtainable from the present application are not limited to the above-described effects, and other effects may exist.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for manufacturing a perovskite solar cell, the method comprising:
    disposing an electron transport layer on a transparent conductive substrate;
    disposing an additive-doped perovskite light absorption layer on the electron transport layer;
    disposing a hole transport layer on the additive-doped perovskite light absorption layer; and
    disposing an electrode on the hole transport layer,
    wherein the disposing of the additive-doped perovskite light absorption layer comprises:
    adding an additive having hydrophobicity to a perovskite precursor solution; and
    applying the additive-added perovskite precursor solution onto the electron transport layer to form the additive-doped perovskite light absorption layer, and
    wherein the additive comprises one selected from the group consisting of 4,4'-(hexafluoroisopropylidene) diphthalic anhydride, 4,4'-carbonyldiphthalic anhydride and combinations thereof.

2. The method of claim 1, wherein the additive promotes crystal formation by reacting with the perovskite precursor.

3. The method of claim 1, wherein the applying of the perovskite precursor solution onto the electron transport layer is performed by a method selected from the group consisting of spin coating, bar coating, nozzle printing, spray coating, slot die coating, gravure printing, inkjet printing, screen printing, electrohydrodynamic jet printing, electrospray, and combinations thereof.

4. The method of claim 1, wherein the additive-doped perovskite light absorption layer each independently includes a perovskite material represented by:

$$RMX_3, \text{ or} \qquad \text{[Chemical Formula 3]}$$

$$R_4MX_6, \qquad \text{[Chemical Formula 4]}$$

wherein R is an alkali metal or a $C_1$-$C_{24}$ substituted or unsubstituted alkyl group, when R is substituted, the substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion.

5. The method of claim 1, wherein the transparent conductive substrate comprises one selected from the group consisting of FTO, ITO, IZO, ZnO—$Ga_2O_3$, ZnO—$Al_2O_3$, $SnO_2$—$Sb_2O_3$, and combinations thereof.

6. The method of claim 1, wherein the electron transport layer comprises one selected from the group consisting of $TiO_2$, ZrO, $Al_2O_3$, $SnO_2$, ZnO, $WO_3$, $Nb_2O_5$, $TiSrO_3$, and combinations thereof.

7. The method of claim 1, wherein the hole transport layer comprises one selected from the group consisting of Spiro-OMeTAD, PEDOT:PSS, G-PEDOT, PANI:PSS, PANI:CSA, PDBT, P3HT, PCPDTBT, PCDTBT, PTAA, $MoO_3$, $V_2O_5$, NiO, $WO_3$, CuI, CuSCN, and combinations thereof.

8. The method of claim 1, wherein the electrode comprises one selected from the group consisting of Au, Ag, Pt, Ni, Cu, In, Ru, Pd, Rh, Mo, Ir, Os, C, a conductive polymer, and combinations thereof.

* * * * *